(12) United States Patent
Kim et al.

(10) Patent No.: US 12,218,223 B2
(45) Date of Patent: Feb. 4, 2025

(54) METHOD OF MANUFACTURING SEMICONDUCTOR DEVICE

(71) Applicant: SAMSUNG ELECTRONICS CO., LTD., Suwon-si (KR)

(72) Inventors: Choongsun Kim, Suwon-si (KR); Shigenobu Maeda, Seongnam-si (KR); Myoungkyu Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 374 days.

(21) Appl. No.: 17/877,251

(22) Filed: Jul. 29, 2022

(65) Prior Publication Data
US 2023/0127871 A1    Apr. 27, 2023

(30) Foreign Application Priority Data
Oct. 25, 2021    (KR) .................. 10-2021-0142573

(51) Int. Cl.
*H01L 29/66* (2006.01)
*H01L 21/8238* (2006.01)
*H01L 29/78* (2006.01)

(52) U.S. Cl.
CPC .......... *H01L 29/66795* (2013.01); *H01L 21/823814* (2013.01); *H01L 21/823821* (2013.01); *H01L 29/7851* (2013.01)

(58) Field of Classification Search
CPC ....... H01L 29/66795; H01L 21/823814; H01L 21/823821; H01L 29/7851; H01L 29/0847; H01L 21/823418; H01L 21/823431; H01L 29/66545; H01L 29/785
See application file for complete search history.

(56) References Cited

U.S. PATENT DOCUMENTS

| | | |
|---|---|---|
| 9,331,204 B2 | 5/2016 | Lue |
| 9,520,396 B2 | 12/2016 | Singh |
| 10,103,248 B2 | 10/2018 | Chen et al. |
| 10,748,899 B2 | 8/2020 | Chen et al. |

(Continued)

FOREIGN PATENT DOCUMENTS

| | | |
|---|---|---|
| KR | 10-1175229 B1 | 7/2007 |
| KR | 10-1140584 A | 8/2011 |

*Primary Examiner* — Karen Kusumakar
*Assistant Examiner* — Adam S Bowen
(74) *Attorney, Agent, or Firm* — Fish & Richardson P.C.

(57) ABSTRACT

A method of manufacturing a semiconductor device includes forming an active fin protruding from a substrate and extending in a first direction; forming sacrificial gate patterns intersecting the active fin and extend in a second direction; forming recess regions by etching the active fin on at least one side of each of the sacrificial gate patterns; forming source/drain regions on the recess regions; removing the sacrificial gate patterns to form openings; and forming a gate dielectric layer and a gate electrode such that gate structures are formed to cover the active fin in the openings. The source/drain regions are formed by an epitaxial growth process and an in-situ doping process of doping first conductivity-type impurity elements. In at least one of the source/drain regions, after the in-situ doping process is performed, counter-doping is performed using second conductivity-type impurity elements different from the first conductivity-type impurity elements to decrease carrier concentration.

20 Claims, 22 Drawing Sheets

(56) References Cited

U.S. PATENT DOCUMENTS

| | | | |
|---|---|---|---|
| 2008/0003756 A1* | 1/2008 | Rouh | H01L 21/26506 |
| | | | 257/E21.336 |
| 2012/0193707 A1 | 8/2012 | Huang et al. | |
| 2014/0210009 A1 | 7/2014 | Xiao et al. | |
| 2020/0027895 A1* | 1/2020 | Cho | H01L 27/0924 |
| 2021/0036108 A1 | 2/2021 | Singh et al. | |
| 2021/0184045 A1 | 6/2021 | Ramaswamy et al. | |

* cited by examiner

METHOD OF MANUFACTURING SEMICONDUCTOR DEVICE

CROSS-REFERENCE TO RELATED APPLICATION(S)

A claim of priority under 35 U.S.C. § 119 is made to Korean Patent Application No. 10-2021-0142573 filed on Oct. 25, 2021 in the Korean Intellectual Property Office, the entirety of which is hereby incorporated by reference.

BACKGROUND

The present disclosure relates to methods of manufacturing semiconductor devices.

As the integration density of semiconductor devices has increased, fin field-effect transistors (FinFETs) having three-dimensional (3D) structures, which may supersede two-dimensional (2D) transistors, have been developed to overcome limitations of FETs.

FinFET devices have a structure which may reduce a short channel effect. FinFET devices include a fin-type active region. Since the channel region is formed in the fin-type active region, FinFET devices may have a significantly effective channel width in a relatively small horizontal region, as compared with planar transistors. Accordingly, FinFET devices have higher scalability and performance than planar transistors having similar size, and thus may be applied to various low-power and high-performance applications.

SUMMARY

Embodiments of the inventive concepts provide a semiconductor device having electrical characteristics and improved reliability by reducing or significantly reducing occurrence of gate induced drain leakage (GIDL) and generation of hot carriers in a transistor to which a high voltage is applied as a driving voltage.

Embodiments of the inventive concepts provide a method of manufacturing a semiconductor device including forming an active fin to protrude from a substrate and extend in a first direction; forming a sacrificial gate pattern to intersect the active fin and extend in a second direction, the second direction perpendicular to the first direction; forming a recess region on the active fin on at least one side of the sacrificial gate pattern; forming a source/drain region on the recess region of the active fin; removing the sacrificial gate pattern to form an opening; and depositing a gate dielectric layer and a gate electrode to form a gate structure that covers the active fin in the opening. The forming the source/drain region includes forming an initial source/drain region having a first carrier concentration on the recess region of the active fin by performing an epitaxial growth process and an in-situ doping process of doping first conductivity-type impurity elements; and forming the source/drain region having a second carrier concentration less than the first carrier concentration by changing a carrier concentration of the initial source/drain region.

Embodiments of the inventive concepts further provide a method of manufacturing a semiconductor device including forming an active fin to protrude from a substrate and extend in a first direction; forming a plurality of sacrificial gate patterns to intersect the active fin and extend in a second direction, the second direction perpendicular to the first direction; forming recess regions by etching the active fin on at least one side of each of the plurality of sacrificial gate patterns; forming source/drain regions on the recess regions of the active fin; removing the plurality of sacrificial gate patterns to form a plurality of openings; and forming a gate dielectric layer and a gate electrode to form a plurality of gate structures that cover the active fin in the plurality of openings. The source/drain regions are formed by performing an epitaxial growth process and an in-situ doping process of doping first conductivity-type impurity elements. In at least one of the source/drain regions, after the in-situ doping process is performed, counter-doping is performed using second conductivity-type impurity elements to decrease a final carrier concentration. The second conductivity-type impurity elements are different from the first conductivity-type impurity elements.

Embodiments of the inventive concepts still further provide a method of manufacturing a semiconductor device including forming a first active fin on a low-voltage region of a substrate, and a second active fin on a high-voltage region of the substrate; forming a first sacrificial gate pattern to intersect the first active fin, and a second sacrificial gate pattern to intersect the second active fin; forming first recess regions by etching the first active fin on opposite sides of the first sacrificial gate pattern, and second recess regions by etching the second active fin on opposite sides of the second sacrificial gate pattern; forming first source/drain regions on the first recess regions and second source/drain regions on the second recess regions by performing an epitaxial growth process and an in-situ doping process of doping first conductivity-type impurity elements; and implanting second conductivity-type impurity elements into the second source/drain regions on the high-voltage region such that a concentration of carriers in the second source/drain regions is decreased to be less than a concentration of carriers in the first source/drain regions, the second conductivity-type impurity elements are different from the first conductivity-type impurity elements.

BRIEF DESCRIPTION OF DRAWINGS

The above and other aspects, features, and advantages of the inventive concepts will be more clearly understood from the following detailed description, taken in conjunction with the accompanying drawings, wherein.

DETAILED DESCRIPTION

Figure 1:
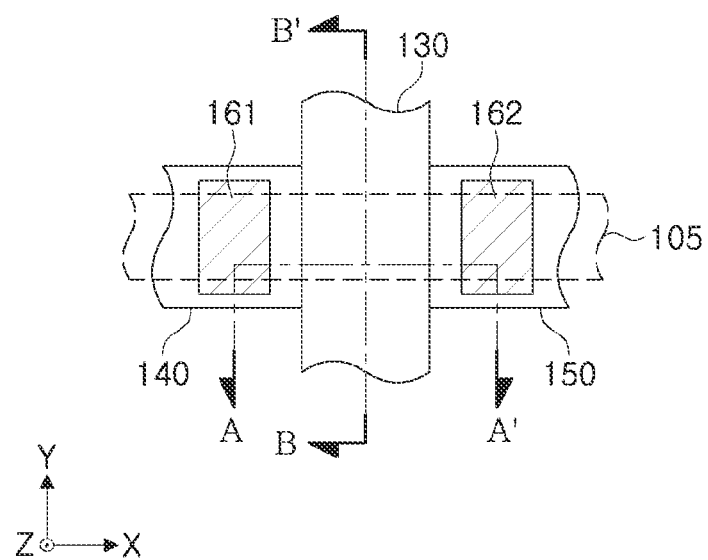
FIG. 1 illustrates a plan view of a semiconductor device according to embodiments of the inventive concepts.

Embodiments now will be described more fully hereinafter with reference to the accompanying drawings. Like reference numerals refer to like elements throughout.

Figure 2:
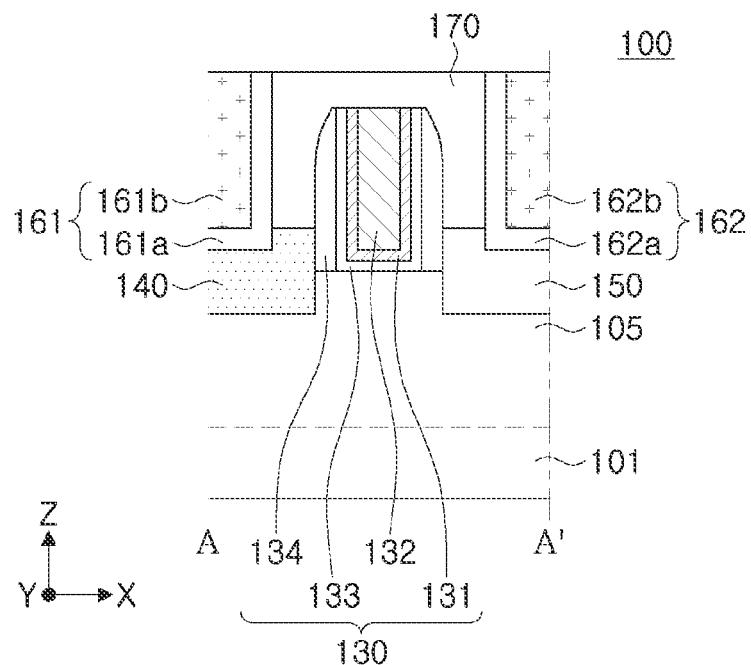
FIG. 2 illustrates a cross-sectional view taken along line A-A' of FIG. 1.
Figure 3:
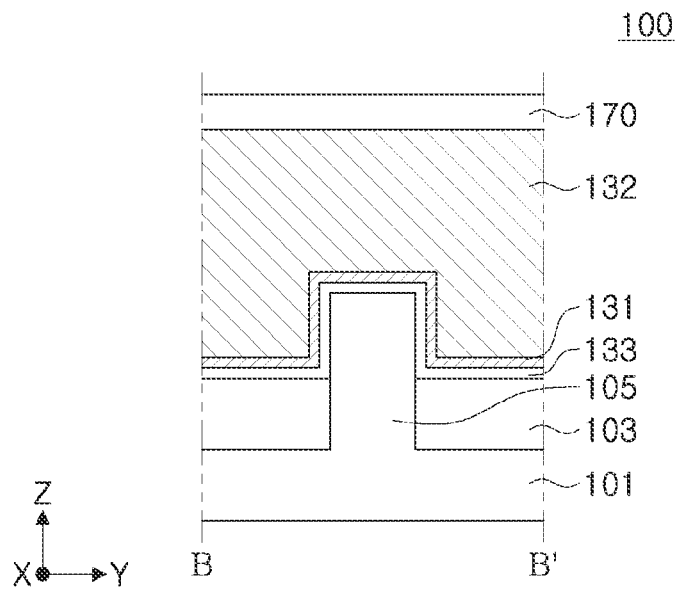
FIG. 3 illustrates a cross-sectional view taken along line B-B' of FIG. 1.

FIG. 1 illustrates a plan view of a semiconductor device according to embodiments of the inventive concepts. FIGS. 2 and 3 illustrate cross-sectional views taken along lines A-A' and B-B' of FIG. 1, respectively.

Referring to FIGS. 1 to 3, a semiconductor device 100 may include a substrate 101, an active fin 105 extending from the substrate 101 in a first direction X, a gate structure 130 intersecting the active fin 105 and extending in a second direction Y, and a source region 150 and a drain region 140 disposed on the active fin 105 on opposite sides adjacent to the gate structure 130. The semiconductor device 100 may further include a device isolation layer 103 defining an active fin 105 in a substrate 101, contacts 161 and 162 respectively connected to a source region 150 and a drain region 140, and an interlayer insulating layer 170.

The semiconductor device 100 may include FinFET devices that are transistors in which the active fin 105 has a fin structure. The FinFET devices may include transistors arranged around an active fin 105 and a gate structure 130 intersecting each other. For example, the semiconductor device 100 may include at least one of NMOS transistors and PMOS transistors.

The substrate 101 may include a semiconductor material, for example, a group IV semiconductor, a group III-V compound semiconductor, or a group II-VI compound semiconductor. For example, the group IV semiconductor may include silicon (Si), germanium (Ge), or silicon-germanium (SiGe). The substrate 101 may be provided as a bulk wafer, an epitaxial layer, a silicon-on-insulator (SOI) layer, a semiconductor-on-insulator (SeOI) layer, or the like.

The device isolation layer 103 may define an active fin 105 on the substrate 101. The device isolation layer 103 may be formed by, for example, a shallow trench isolation (STI) process. Although not shown, in some embodiments the device isolation layer 103 may include a region extending deeper downwardly of the substrate 101. Although not shown, the device isolation layer 103 may have a curved upper surface having a level increased in a direction toward the active fin 105, but a shape of the upper surface of the device isolation layer 103 is not limited thereto. The device isolation layer 103 may include an insulating material, for example, at least one of a silicon oxide, a silicon nitride, a silicon oxynitride, and a silicon oxycarbide.

The active fin 105 may be defined by the device isolation layer 103 in the substrate 101 and may extend in a first direction (an X-direction). The active fin 105 may have a structure protruding from the substrate 101. An upper end of the active fin 105 may be disposed to protrude from an upper surface of the device isolation layer 103 by a predetermined height. The active fin 105 may be provided as a portion of the substrate 101, or may include an epitaxial layer grown from the substrate 101. However, a portion of the active fin 105 on the substrate 101 may be recessed on opposite sides of the gate structure 130, and the source region 150 and the drain region 140 may be disposed on the recessed portion of the active fin 105. In some embodiments, the active fin 105 may include a plurality of active fins 105 disposed to be spaced apart from each other in the second direction (a Y-direction).

The gate structure 130 may intersect the active fin 105 and extend in a second direction (a Y-direction). A channel region of a transistor may be formed in the active fin 105 intersecting the gate structure 130. The gate structure 130 may include layers 131, 132, and 133, and gate spacer layers 134 on at least one side of the layers 131, 132, and 133. The layers 131, 132, and 133 may include a gate dielectric layer 133, and gate electrodes 131 and 132 disposed on the gate dielectric layer 133.

The gate electrodes 131 and 132 may be spaced apart from the active fin 105 by the gate dielectric layer 133. The gate electrodes 131 and 132 may include a first gate layer 131 and a second gate layer 132 on the first gate layer 131. The gate electrodes 131 and 132 may include a conductive material, for example, at least one of W, Ti, Ta, Mo, TiN, TaN, WN, TiON, TiAlC, TiAlN, and TaAlC. The gate electrodes 131 and 132 may include a semiconductor material such as doped polysilicon.

The gate dielectric layer 133 may be disposed between the active fin 105 and the gate electrodes 131 and 132. The gate dielectric layer 133 may be disposed to cover at least some surfaces, among surfaces of the gate electrodes 131 and 132. For example, the gate dielectric layer 133 may be disposed to surround all surfaces of the gate electrodes 131 and 132, except for uppermost surfaces of the gate electrodes 131 and 132. The gate dielectric layer 133 may for example include a silicon oxide, a silicon nitride, or a high-k material. The high-k material may refer to a dielectric material having a dielectric constant higher than a dielectric constant of a silicon oxide. The high dielectric constant material may be provided as one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In an example embodiment, a thickness of the gate dielectric layer 133 may range from about 1.5 nm to about 10 nm, and the semiconductor device 100 may include a transistor having a thick oxide.

The gate spacer layers 134 may be disposed on opposite side surfaces of the gate electrodes 131 and 132. Each of the gate spacer layers 134 may include a portion having a curved external side surface such that an upper width thereof is narrower than a lower width thereof. The gate spacer layers 134 may insulate the source region 150 and the drain region 140 from the gate electrodes 131 and 132. In some embodiments, the gate spacer layers 134 may have a multilayer structure. The gate spacer layers 134 may include an insulating material, for example, at least one of a silicon oxide, a silicon nitride, a silicon oxynitride, and a silicon oxycarbide.

In an example embodiment, the gate structure 130 may further include a gate capping layer (not illustrated) on the layers 131, 132, and 133. The gate capping layer may be disposed to fill a region in which the layers 131, 132, and 133 are partially removed from upper portions thereof, such that side surfaces of the gate capping layer are surrounded by the gate spacer layers 134. In other embodiments, the gate capping layer may fill a region in which the layers 131, 132 and 133 and the gate spacer layers 134 are partially removed from upper portions thereof.

The source region 150 and the drain region 140 may be disposed on opposite sides of the channel region of the active fin 105 intersecting the gate structure 130. The source region 150 and the drain region 140 may be disposed by recessing a portion of the upper portion of the active fin 105 on opposite sides of the gate structure 130. However, in example embodiments, the presence of a recess and the depth of the recess can be variously changed. The source region 150 and the drain region 140 may be a semiconductor layer including silicon (Si) or silicon germanium (SiGe), and may include an epitaxial layer. Each of the source region 150 and the drain region 140 may include a plurality of layers including different concentrations of elements and/or doping elements.

Figure 14:
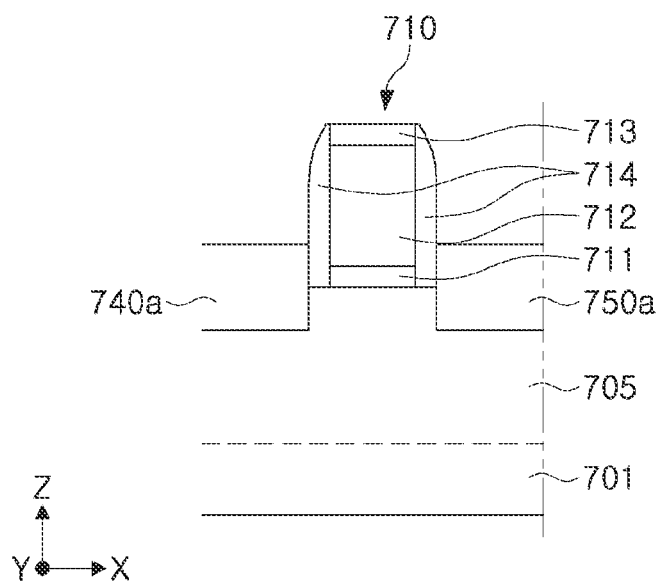
Figure 15:
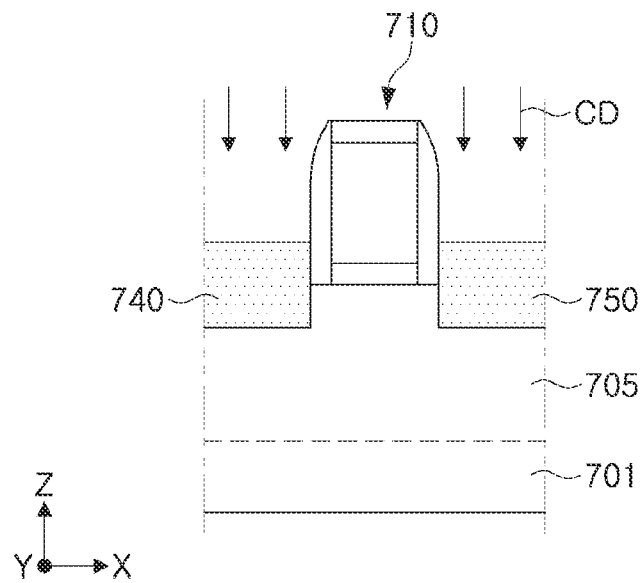

According to an example embodiment, a concentration of majority carriers in the drain region 140 may be decreased to be less than an initial level due to counter-doping. For example, an initial drain region (740a of FIG. 14) may be formed as a drain region 140 having a first carrier concentration by being implanted with first conductivity-type impurity elements, and then having a second carrier concentration less than the first carrier concentration by counter-doping the initial drain region with second conductivity-type impurity elements different from the first conductivity-type impurity elements. A doping concentration of the second conductivity-type impurity elements may be less than a doping concentration of the first conductivity-type impurity elements. For example, in the drain region 140, electrons which may be majority carriers provided by doping of N-type impurity elements are compensated by holes provided by P-type impurity elements doped by the counter-doping, so that a final concentration of majority carriers by the N-type impurity elements may be decreased in the drain region 140.

The first conductivity-type impurity element is a pentavalent N-type impurity element, and may include at least one of phosphorus (P), arsenic (As), bismuth (Bi), and antimony (Sb). The second conductivity-type impurity element is a trivalent P-type impurity element and may include at least one of boron (B), indium (In), and gallium (Ga). In contrast, in other embodiments the first conductivity-type impurity element may include a trivalent P-type impurity element, and the second conductivity-type impurity element may include a pentavalent N-type impurity element.

The carrier concentration may refer to a concentration of a plurality of carriers remaining after electrons and holes are substituted for each other when impurities having two different conductivity types are doped. For example, when the first conductivity-type impurity elements are N-type impurity elements and the second conductivity-type impurity elements are P-type impurity elements, the majority carriers of the drain region 140 may be electrons. For example, when the first conductivity-type impurity elements are P-type impurity elements and the second conductivity-type impurity elements are N-type impurity elements, the majority carriers of the drain region 140 may be holes.

In an example embodiment, a concentration of net impurities in the drain region 140 may range from about $1 \times 10^{15}$ atoms/cm$^3$ to about $1 \times 10^{22}$ atoms/cm$^3$.

Currently commercialized FinFET devices have a low operating voltage of 0.7V to 1V. Meanwhile, analog devices such as input/output (I/O) devices are driven with a high voltage such as 3.3V for example. When such a high voltage is applied to a FinFET device, a high electric field in a drain region may result in deterioration of hot carrier characteristics and an increase in leakage current such as gate induced drain leakage (GIDL) or the like.

In detail, a source and a drain may formed in a currently commercialized FinFET process by an epitaxial growth process after a fin recess process, and the source and drain regions may be heavily doped by an in-situ doping process. The source and drain having the high-concentration impurities may have an advantage in which resistance is decreased to increase output current. However, the high-concentration impurities may increase a maximum electric field in a drain region to additionally deteriorate the above-mentioned reliability and leakage current characteristics. Therefore, it may be difficult to apply a FinFET device to a high-voltage driving device such as an analog device in terms of reliability and characteristics in an OFF state of a transistor.

Gate induced drain leakage (GIDL) may occur when there is a large difference in voltage between gate and drain regions in a FET in an OFF state. When a channel length is decreased, a maximum electric field applied to carriers may be increased in a portion of a channel region adjacent to the drain region, and carriers may move from the source region to the drain region to obtain kinetic energy large enough to cause impact ionization to occur in a high electric field region of a drain junction. Some of these carriers may enter an oxide layer across a barrier of a Si—SiO$_2$ boundary. Carriers having higher energy than such high thermal energy may no longer be maintained in a thermal equilibrium state with a lattice. Such carriers are referred to as "hot carriers." Such hot carriers and GIDL may be closely related to a magnitude of the maximum E-field.

In the case of a FinFET structure according to the related art, a length between a drain region and a source region is short, and thus, a magnitude of an electric field (E-field) applied between the source and drain may be increased to cause tunneling in which electrons move to the other side band. As a result, hot carriers may be generated and GIDL may occur.

Since the GIDL is caused by energy band deformation resulting from a voltage difference, a concentration of a junction surface of an energy band may be decreased to prevent carriers from moving. In addition, in the case of hot carriers, a portion having a low concentration may be added between a drain region and a body to prevent a depletion layer from expanding.

According to an example embodiment, a concentration of majority carriers may be decreased to be less than an initial level in the drain region 140 due to (or by) counter-doping, so that an electric field of the drain region 140 may be reduced. Accordingly, generation of GIDL current and generation of hot carriers in the drain region 140 may be reduced or significantly reduced to improve electrical characteristics and reliability of the semiconductor device. In the present disclosure, an analog device such as an input/output (I/O) device may be implemented as a FinFET device. In this case, even when a relatively high voltage is applied to the FinFET device, generation of GIDL current and generation of hot carriers may be significantly reduced.

The contacts 161 and 162 may penetrate through the interlayer insulating layer 170 to be connected to the source region 150 and the drain region 140. The contacts 161 and 162 may apply electrical signals to the source region 150 and the drain region 140. Each of the contacts 161 and 162 may include barrier layers 161a and 162a, and metal layers 161b and 162b. The barrier layers 161a and 162a may surround lower surfaces and side surfaces of the metal layers 161b and 162b. The barrier layers 161a and 162a may include a metal nitride, for example, at least one of titanium nitride (TiN), tantalum nitride (TaN), and tungsten nitride (WN). The metal layers 161b and 162b may include a metal, for example, at least one of aluminum (Al), copper (Cu), tungsten (W), cobalt (Co), ruthenium (Ru), and molybdenum (Mo). In some embodiments, the barrier layers 161a and 162a may be omitted.

The contacts 161 and 162 may include a first contact 161 connected to the drain region 140, and a second contact 162 connected to the source region 150. The first contact 161 may be applied with a driving voltage VDD ranging from about 1.2V to about 50V. In example embodiments, the first contact 161 may be applied with a driving voltage VDD of about 3.3V, or a driving voltage VDD ranging from about 3.1V to about 3.5V.

The interlayer insulating layer 170 may be disposed on the source region 150, the drain region 140, and the gate structure 130. The interlayer insulating layer 170 may also be disposed on an upper surface of the device isolation layer 103 which is not covered with the gate structure 130. The interlayer insulating layer 170 may include at least one of, for example, a silicon oxide, a silicon nitride, a silicon oxynitride, and a silicon oxycarbide. The interlayer insulating layer 170 may include a plurality of insulating layers.

Figure 4:
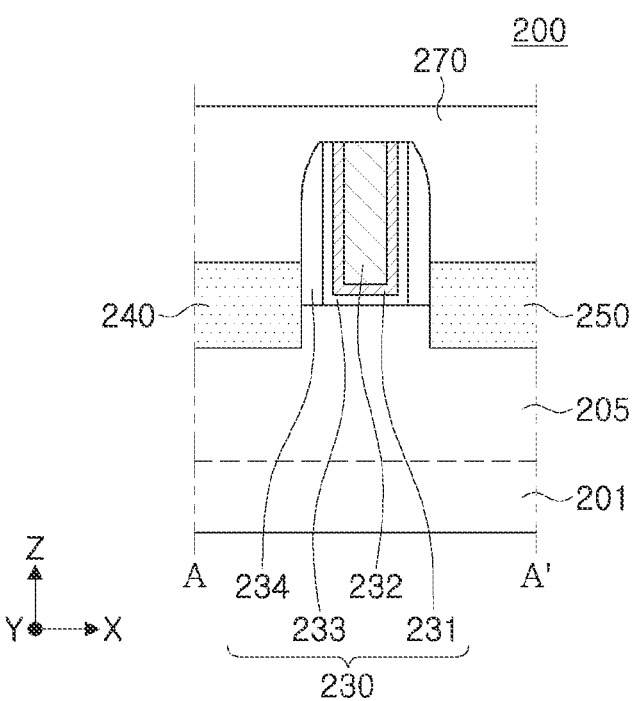
FIG. 4 illustrates a cross-sectional view of a semiconductor device according to embodiments of the inventive concepts.

FIG. 4 illustrates a cross-sectional view of a semiconductor device according to embodiments of the inventive concepts. FIG. 4 illustrates a region corresponding to FIG. 2 and includes similar reference numerals as shown in FIG. 2. Regarding FIG. 4, description of features indicated by reference numerals 201, 205, 230, 231, 232, 233, 234 and 270 similar or overlapping with those of FIG. 2 may be omitted for brevity, and contacts are not illustrated in FIG. 4 for ease of description.

Referring to FIG. 4, in a semiconductor device 200, counter-doping may be performed on both a source region 250 and a drain region 240, and thus a concentration of majority carriers may be decreased to be less than an initial level. When a transistor of the semiconductor device 200 illustrated in FIG. 4 is an NMOS transistor, a final concentration of electrons, which are majority carriers generated by N-type impurity elements of each of the source region 250 and the drain region 240, may be decreased due to (or by) counter-doping of P-type impurity elements. In contrast, when a transistor of the semiconductor device 200 illustrated in FIG. 4 is a PMOS transistor, a final concentration of holes, which are majority carriers generated by P-type impurity elements in each of the source region 250 and the drain region 240, may be decreased due to counter-doping of N-type impurity elements.

Figure 5:
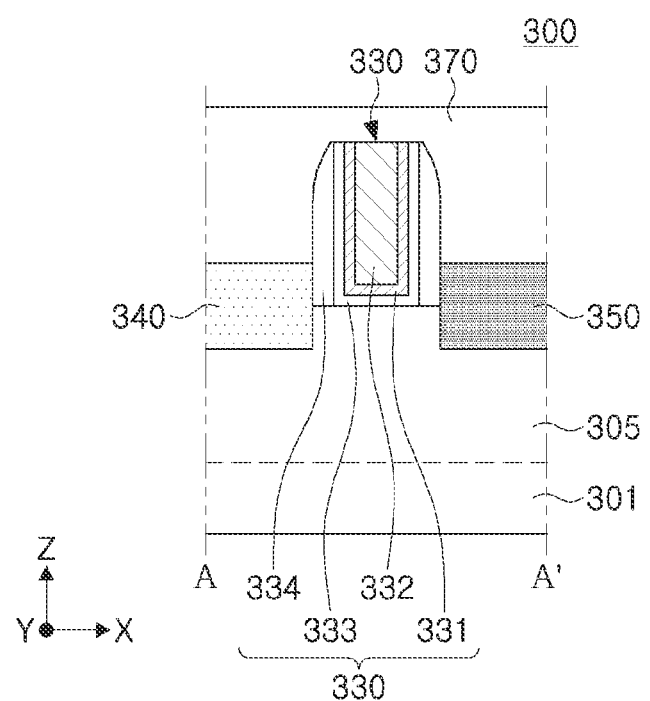
FIG. 5 illustrates a cross-sectional view of a semiconductor device according to embodiments of the inventive concepts.

FIG. 5 illustrates a cross-sectional view of a semiconductor device according to embodiments of the inventive concepts. FIG. 5 illustrates a region corresponding to FIG. 2 and includes similar reference numerals as shown in FIG. 2. Regarding FIG. 5, description of features indicated by reference numerals 301, 305, 330, 331, 332, 333, 334 and 370 similar or overlapping those of FIG. 2 may be omitted for brevity, and contacts are not illustrated in FIG. 5 for ease of description.

Referring to FIG. 5, in a semiconductor device 300, counter-doping may be performed on both a source region 350 and a drain region 340, and thus, a concentration of majority carriers may be decreased to be less than an initial level, and a final concentration of majority carriers in the drain region 340 may be less than a final concentration of majority carriers in the source region 350.

Figure 6A:
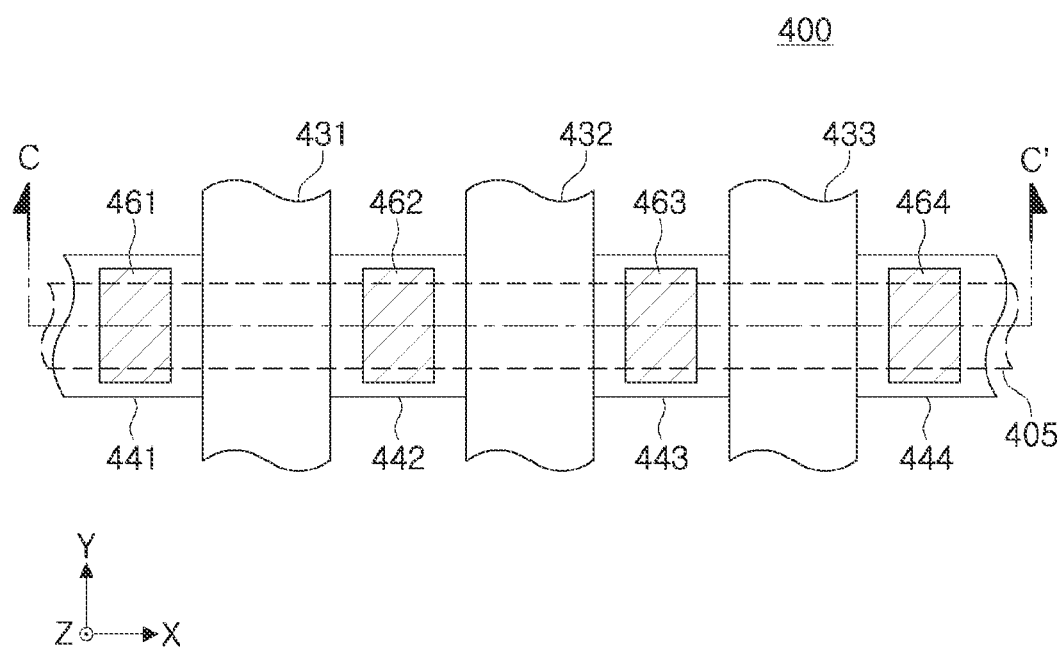
FIG. 6A illustrates a plan view of a semiconductor device according to embodiments of the inventive concepts.
Figure 6B:
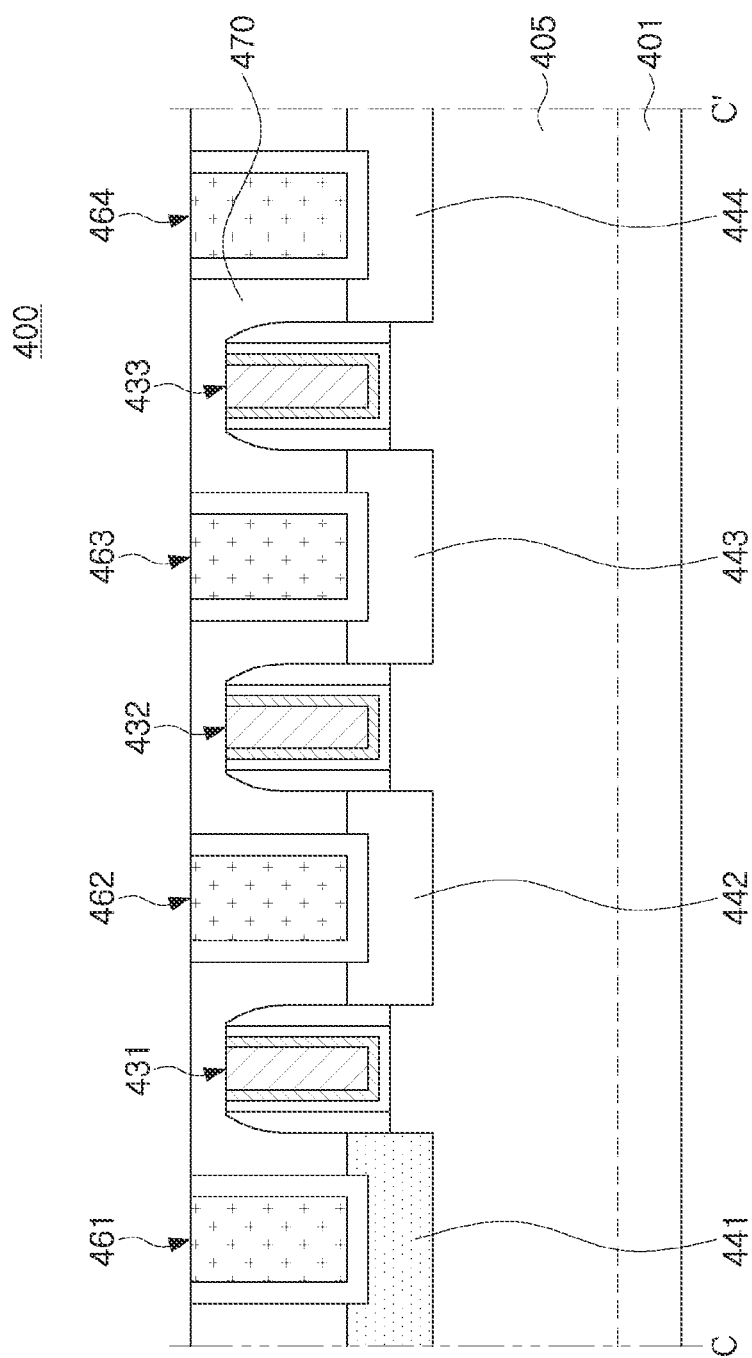
FIG. 6B illustrates a cross-sectional view taken along line C-C' of FIG. 6A.

FIG. 6A illustrates a plan view of a semiconductor device according to embodiments of the inventive concepts. FIG. 6B illustrates a cross-sectional view taken along line C-C' of FIG. 6A.

Referring to FIGS. 6A and 6B, a semiconductor device 400 may include a substrate 401, an active fin 405, gate structures 431, 432, and 433, source/drain regions 441, 442, 443, and 444, contacts 461, 462, 463, and 464, and an interlayer insulating layer 470. The semiconductor device 400 may include at least one of NMOS transistors and PMOS transistors. One of the source/drain regions 441, 442, 443, and 444 may be provided as a drain region, and another thereof may be provided as a source region. In an example embodiment, the semiconductor device 400 may include a transistor in which the first source/drain region 441 is a drain region and the fourth source/drain region 444 is a source region, to provide a channel region having a larger channel length. In this case, the second and third contacts 462 and 463 may not be connected to an overlying interconnection. Alternatively, as illustrated in FIGS. 7A and 7B, a semiconductor device 400' second and third contacts 462 and 463 are omitted.

The gate structures 431, 432, and 433 may include a first gate structure 431, a second gate structure 432, and a third gate structure 433 spaced apart from each other in a first direction (an X-direction). The second gate structure 432, disposed between the first gate structure 431 and the third gate structure 433 disposed on both ends, may be provided with a plurality of second gate structures 432. In this case, a transistor having a larger channel length may be provided.

In at least one of the source/drain regions 441, 442, 443, and 444, for example the first source/drain region 441 provided as a drain region as shown in in FIGS. 6A and 6B, a concentration of majority carriers may be decreased to be less than an initial level due to counter-doping. Accordingly, an electric field of the first source/drain region 441 provided as a drain region may be reduced, and generation of GIDL current and generation of hot carriers may be reduced or significantly reduced.

Figure 7A:
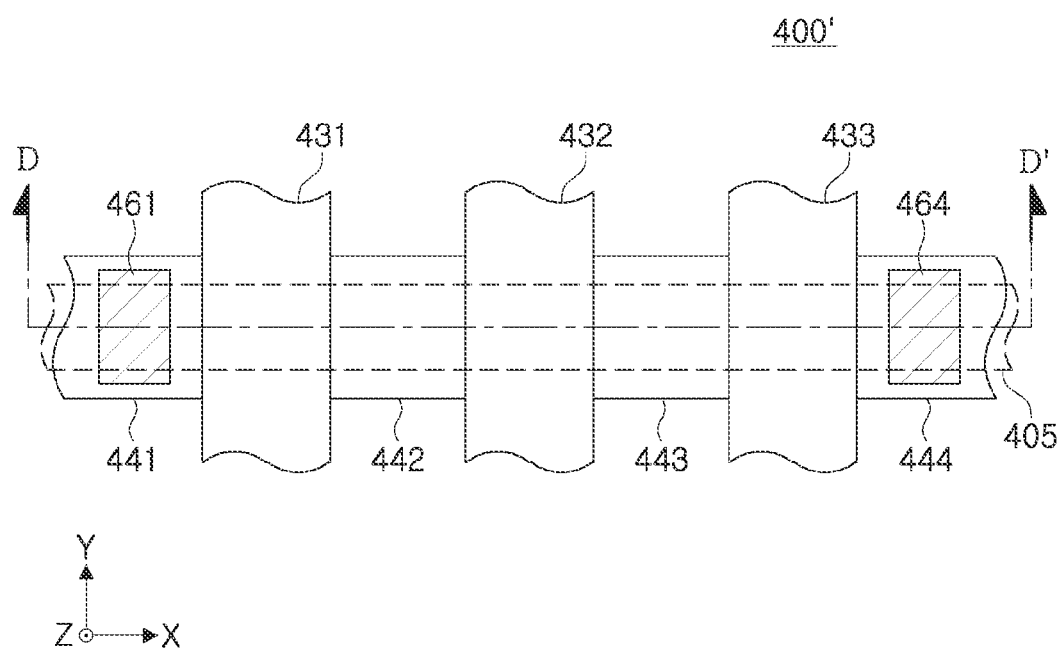
FIG. 7A illustrates a plan view of a semiconductor device according to embodiments of the inventive concepts.
Figure 7B:
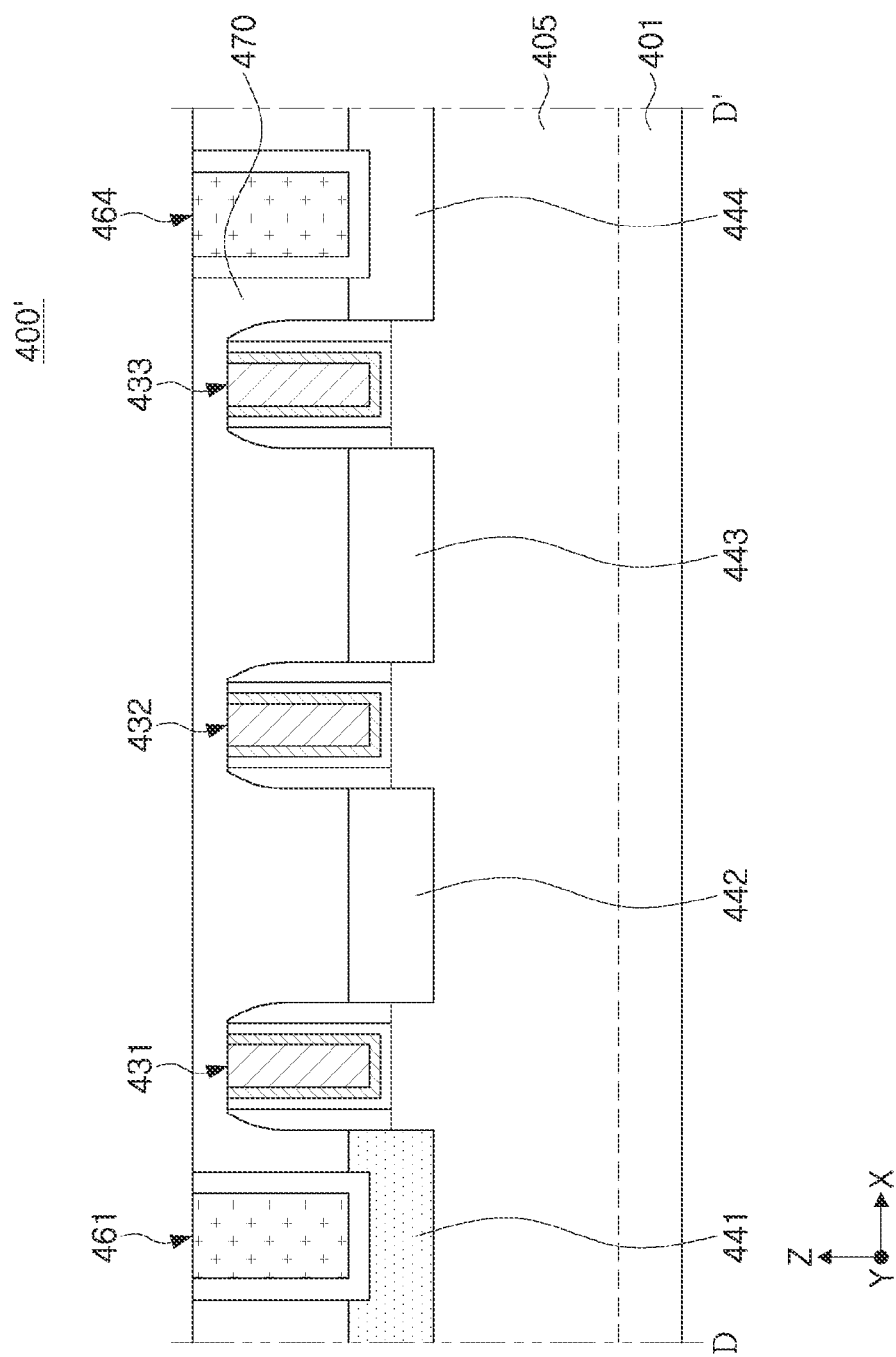
FIG. 7B illustrates a cross-sectional view taken along line D-D' of FIG. 7A.

FIG. 7A illustrates a plan view of a semiconductor device according to embodiments of the inventive concepts. FIG. 7B illustrates a cross-sectional view taken along line D-D' of FIG. 7A.

Referring to FIGS. 7A and 7B, a semiconductor device 400' is similar to the semiconductor device 400 of FIGS. 6A and 6B and includes similar features with similar reference numerals. However, in FIGS. 7A and 7B second and third contacts 462 and 463 as shown in FIGS. 6A and 6B are omitted to provide a transistor including a channel region having a larger channel length. First and fourth source/drain regions 441 and 444 may be in a state of being connected to first and fourth contacts 461 and 464, and second and third source/drain regions 442 and 443 are not in a state of being connected to contacts.

Figure 8:
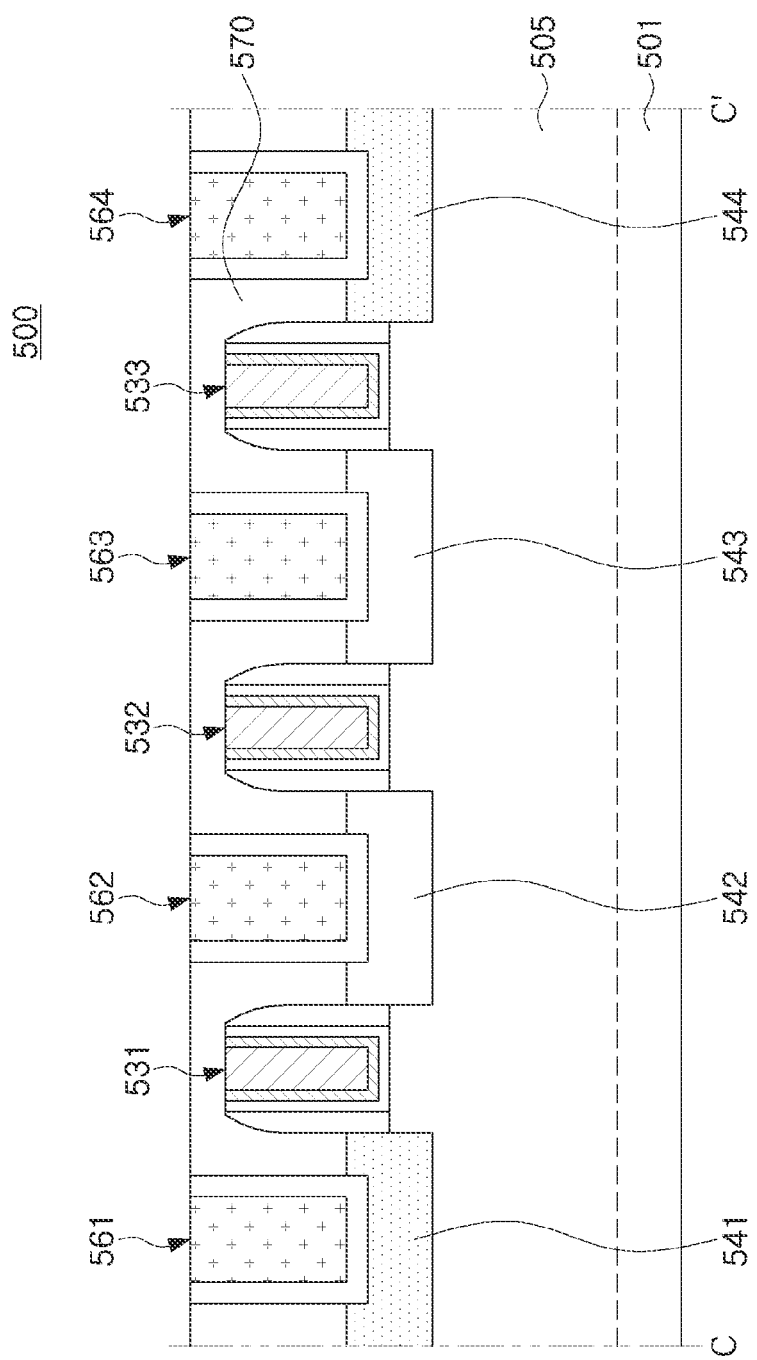
FIGS. 8 and 9 illustrate cross-sectional views of semiconductor devices according to embodiments of the inventive concepts.

FIG. 8 illustrates a cross-sectional view of a semiconductor device according to embodiments of the inventive concepts. FIG. 8 illustrates a region corresponding to FIG. 6B and includes similar reference numerals as shown in FIG. 6B. Regarding the example embodiment of FIG. 8, description of features indicated by reference numerals 501, 505, 531, 532, 533, 542, 543, 561, 562, 563, 564 and 570 similar or overlapping those of FIGS. 6A to 7B may be omitted for brevity.

Referring to FIG. 8, a semiconductor device 500 is similar to the semiconductor device 400 of FIGS. 6A and 6B, however in both a first source/drain region 541 provided as a drain region and a fourth source/drain region 544 provided as a source region, a concentration of majority carriers may be decreased to be less than an initial level due to counter-doping. In other example embodiments, second and third contacts 562 and 563 may also be omitted.

Figure 9:
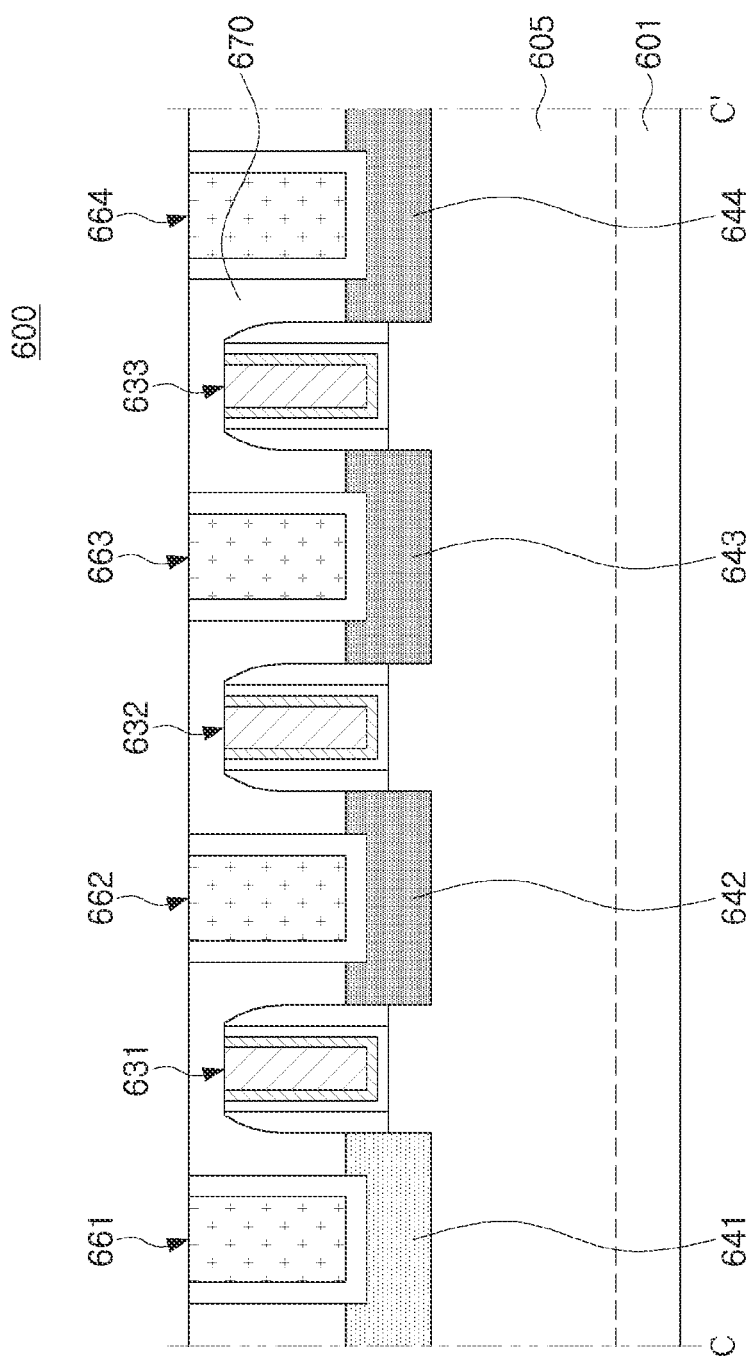

FIG. 9 illustrates a cross-sectional view of a semiconductor device according to embodiments of the inventive concepts. FIG. 9 illustrates a region corresponding to FIG. 6B and includes similar reference numerals as shown in FIG. 6B. Regarding the example embodiment of FIG. 9, description of features indicated by reference numerals 601, 605, 631, 632, 633, 642, 643, 661, 662, 663, 664 and 670 similar or overlapping those of FIGS. 6A to 7B may be omitted for brevity.

Referring to FIG. 9, a semiconductor device 600 is similar to the semiconductor device 500 of FIG. 8, however in source/drain regions 642 and 643 disposed between a first gate structure 631 and a the third gate structure 633, a concentration of majority carriers may also be decreased to be less than an initial level due to counter-doping. Source/drain regions 641, 642, 643, and 644 may have different impurity-doping concentrations or profiles. For example, a final concentration of majority carriers in the first source/drain region 641 may be less than a final concentration of majority carriers in the other source/drain regions 642, 643, and 644. In other example embodiments, the second and third contacts 662 and 663 may also be omitted.

Figure 10A:
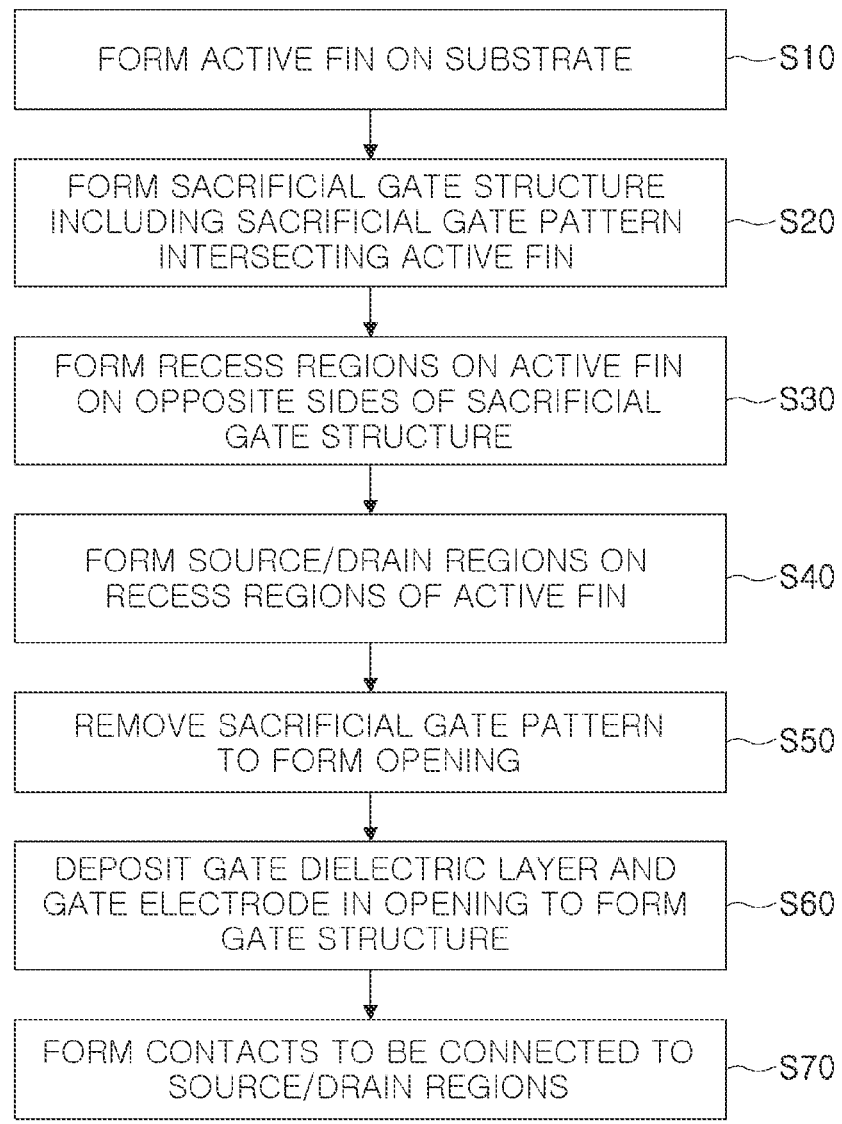
FIGS. 10A and 10B illustrate process flowcharts of a method of manufacturing a semiconductor device according to embodiments of the inventive concepts.
Figure 10B:
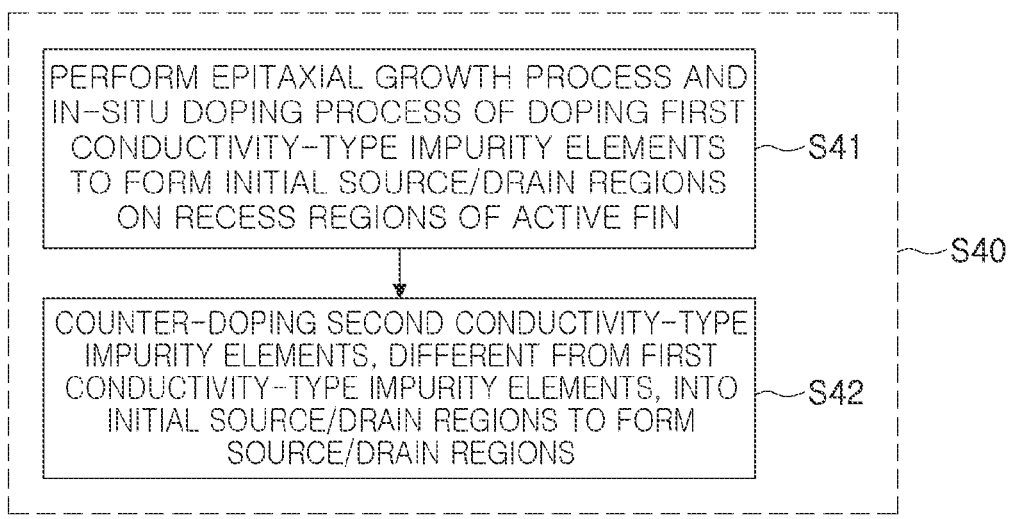

FIGS. 10A and 10B illustrate process flowcharts of a method of manufacturing a semiconductor device according to embodiments of the inventive concepts.

FIGS. 11, 12, 13, 14, 15, 16, 17 and 18 illustrate process flow diagrams of a method of manufacturing a semiconductor device according to embodiments of the inventive concepts.

Figure 11:
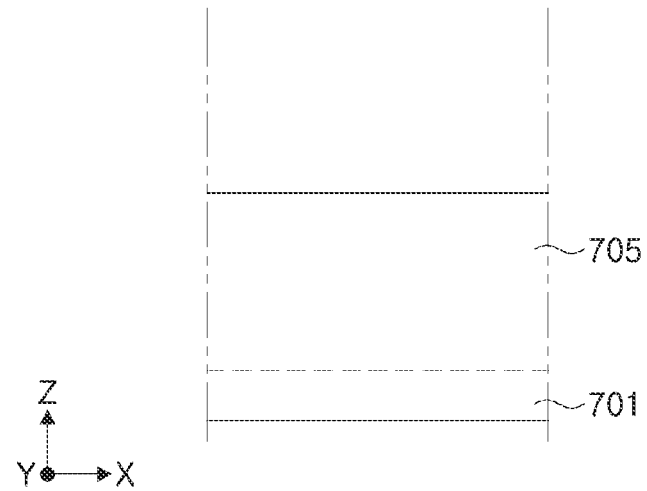
FIGS. 11, 12, 13, 14, 15, 16, 17 and 18 illustrate process flow diagrams of a method of manufacturing a semiconductor device according to embodiments of the inventive concepts.

Referring to FIGS. 10A and 11, in operation S10, an active fin 705 is formed on a substrate 701.

The substrate 701 may be patterned such that a trench (not illustrated) is formed to define the active fin 705, and an insulating material may be buried in a region in which a portion of the substrate 701 is removed, and may then be recessed such that the active fin 705 protrudes. Thus, a device isolation layer (see 103 of FIG. 3) may be formed. An upper surface of the device isolation layer may be formed to be lower than an upper surface of the active fin 705.

Figure 12:
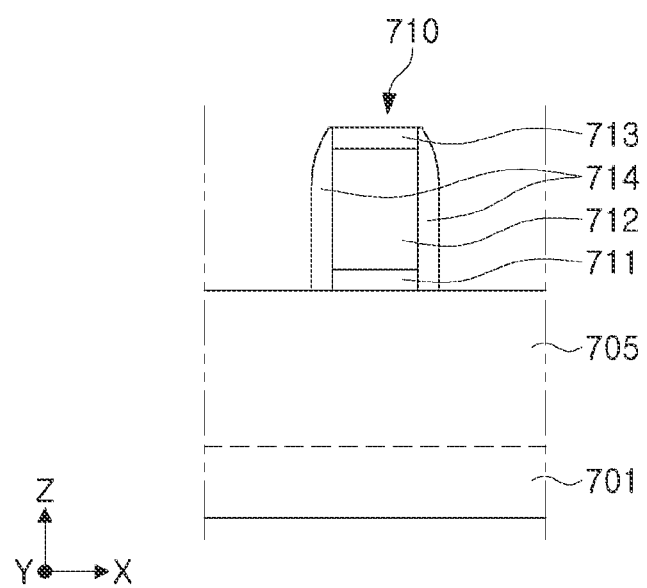

Referring to FIGS. 10A and 12, in operation S20, a sacrificial gate structure 710 including sacrificial gate patterns 711, 712, and 713 intersecting the active fin 705 is formed.

The sacrificial gate patterns 711, 712, and 713 may be sacrificial structures formed in a region in which layers 131, 132, and 133 are disposed on the active fin 105 in a subsequent process, as illustrated in FIG. 2. The sacrificial gate patterns 711, 712, and 713 may intersect the active fin 705 and may extend in a second direction (a Y-direction). The sacrificial gate patterns 711, 712, and 713 may include first and second sacrificial gate layers 711 and 712, and a mask pattern layer 713 sequentially stacked on the substrate 701. The first and second sacrificial gate layers 711 and 712 may be patterned using a mask pattern layer 713. Each of the first and second sacrificial gate layers 711 and 712 may be an insulating layer and a conductive layer, but example embodiments are not limited thereto. The first and second sacrificial gate layers 711 and 712 may be formed as a single layer. For example, the first sacrificial gate layer 711 may include a silicon oxide, and the second sacrificial gate layer 712 may include polysilicon. The mask pattern layer 713 may include at least one of a silicon oxide, a silicon nitride, and a silicon oxynitride.

The forming of a sacrificial gate structure 710 may include forming gate spacer layers 714 to cover opposite surfaces of the sacrificial gate patterns 711, 712, and 713. The gate spacer layers 714 may be formed by forming a layer having a uniform thickness along upper side surfaces of the active fin 705, and upper and side surfaces of the sacrificial gate patterns 711, 712, and 713, and then anisotropically etching the layer.

Figure 13:
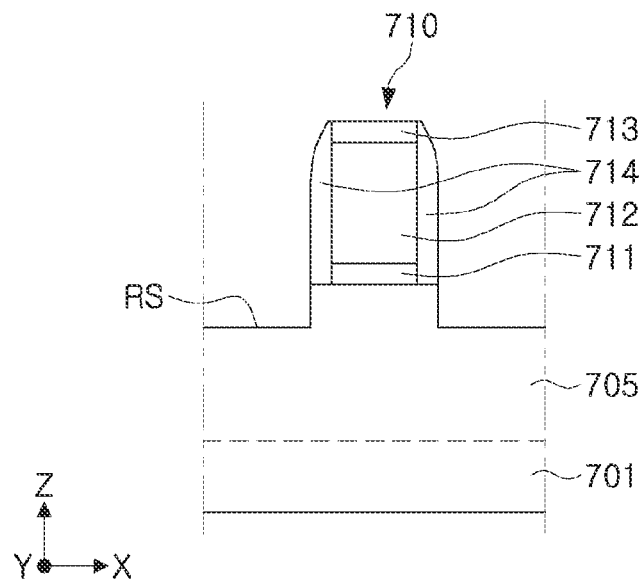

Referring to FIGS. 10A and 13, in operation S30, recess regions RS are formed on the active fin 705 on opposite sides of the sacrificial gate structure 710.

A portion of the active fin 705 may be etched on opposite sides of the sacrificial gate structure 710 to form recess regions RS. The recess regions RS may be formed by removing the active fin 705 downwardly from an upper end thereof by a predetermined depth An etching depth of the recess regions RS and a shape of lower ends of the recess regions are not limited to those illustrated in drawing, and may vary according to example embodiments.

Referring to FIGS. 10A, 10B, 14, and 15, in operation S40, source/drain regions 740 and 750 are formed on the recess region RS of the active fin 705. The operation S40 of forming source/drain regions 740 and 750 may include operation S41, in which an epitaxial growth process and an in-situ doping process of doping first conductivity-type impurity elements are performed to form initial source/drain regions 740a and 750a on the recess regions RS of the active fin 705, and operation S42 in which second conductivity-type impurity elements, different from the first conductivity-type impurity elements, are counter-doped (CD) into the initial source/drain regions 740a and 750a to form source/drain regions 740 and 750.

The initial source/drain regions 740a and 750a may be formed as epitaxial layers by performing an epitaxial growth process from the recess region RS of the active fin 705. While epitaxial layers are formed by performing an epitaxial growth process, the first conductivity-type impurity elements may be implanted by an in-situ doping process. The first conductivity-type impurity elements may be pentavalent N-type impurity elements or trivalent P-type impurity elements. For example, the initial source/drain regions 740a and 750a may include silicon germanium (SiGe) doped with P-type impurity elements or silicon (Si) doped with N-type impurity elements. The initial source/drain regions 740a and 750a may include an initial source region 750a and an initial drain region 740a. Each of the initial source/drain regions 740a and 750a may be formed as a plurality of epitaxial layers.

Counter-doping (CD) may be performed to decrease a concentration of the initial source/drain regions 740a and 750a, so that the initial source/drain regions 740a and 750a may be changed to the source/drain regions 740 and 750 by changing a carrier concentration of the initial source/drain regions 740a and 750a. For example, the initial source/drain regions 740a and 750a may have a first carrier concentration, and the source/drain regions 740 and 750 after performing the counter-doping (CD) may have a second carrier concentration, less than the first carrier concentration. The second carrier concentration may be a final carrier concentration of the source/drain regions 740 and 750, and may be lower than the initial carrier concentration. A doping concentration of second conductivity-type impurities used to perform counter-doping (CD) may be less than a doping concentration of the first conductivity-type impurities.

The counter-doping (CD) may include performing an ion implantation process. Due to the counter-doping (CD), a total concentration of impurity elements in the source/drain regions 740 and 750 may be increased. In the source/drain regions 740 and 750 on which counter-doping (CD) has been performed, impurity elements having opposing conductivity types may coexist. For example, the total concentration of impurity elements in the source/drain regions 740 and 750, on which counter-doping (CD) has been performed, may be increased, but a major carrier concentration of the source/drain regions 740 and 750 may be decreased to be less than a major carrier concentration of the initial source/drain regions 740a and 740b due to substitution of electrons and holes provided by the impurity elements having opposing conductivity types. The counter-doping (CD) may be performed on at least one of the initial source region 750a and the initial drain region 740a. When the first conductivity-type impurity element is a pentavalent N-type impurity element, the second conductivity-type impurity element may be a trivalent P-type (opposite conductivity-type) impurity element. When the first conductivity-type impurity element is a trivalent P-type impurity element, the second conductivity-type (opposite conductivity-type) impurity element may be a pentavalent N-type impurity element.

When the counter-doping (CD) is performed using an ion implantation process, process conditions such as implantation energy, dose, tilt, and the like, of the ion implantation process may vary according to embodiments. A region into which impurity elements are implanted in the counter-doping (CD) may be present in the initial source/drain regions 740a and 750a illustrated in FIG. 14, but may be formed to have various doping profiles depending on the process conditions. A portion of the impurity elements implanted by the counter-doping (CD) may be diffused around a region including an upper end of the active fin 705. The doping profile of the source/drain regions 740 and 750 may be confirmed by, for example, X-ray fluorescence spectrometry (XRF), secondary ion mass spectrometry (SIMS), transmission electron microscopy-energy dispersive X-ray spectroscopy (TEM-EDX), or the like.

Figure 16:
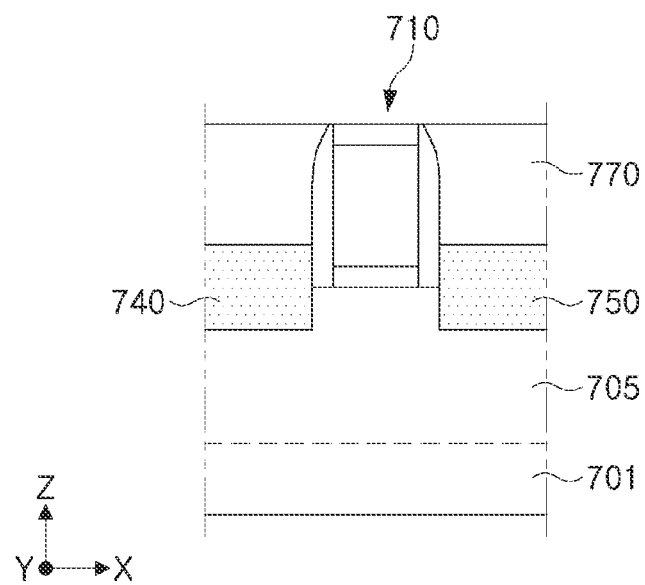
Figure 17:
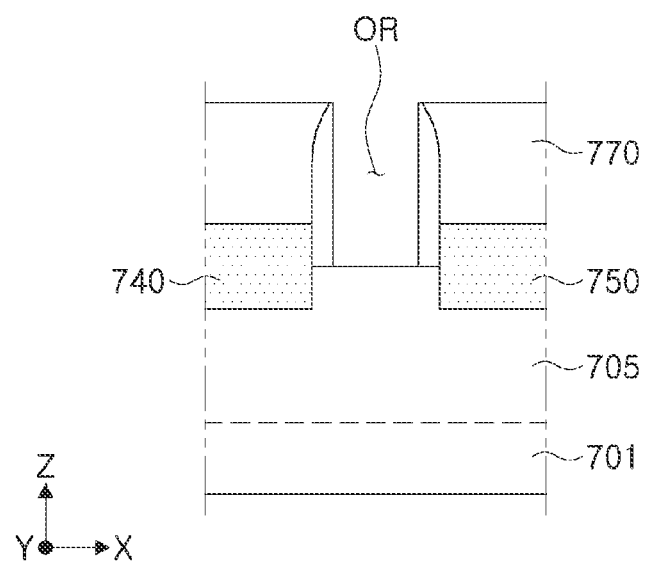

Referring to FIGS. 10A, 16, and 17, in operation S50, an opening OR is formed by forming an interlayer insulating layer 770 and removing the sacrificial gate patterns 711, 712, and 713.

An insulating layer may be formed on the sacrificial gate structure 710 and the source/drain regions 740 and 750, and a planarization process may be performed to expose an upper surface of the mask pattern layer 713, and thus, an interlayer insulating layer 770 may be formed. Before forming the interlayer insulating layer 770, an insulating liner (not illustrated) may be conformally formed.

An opening OR may be formed by removing the first and second sacrificial gate layers 711 and 712 and the mask pattern layer 713. The first and second sacrificial gate layers 711 and 712 and the mask pattern layer 713 may be selectively removed with respect to the gate spacer layers 714 and the interlayer insulating layer 770.

Figure 18:
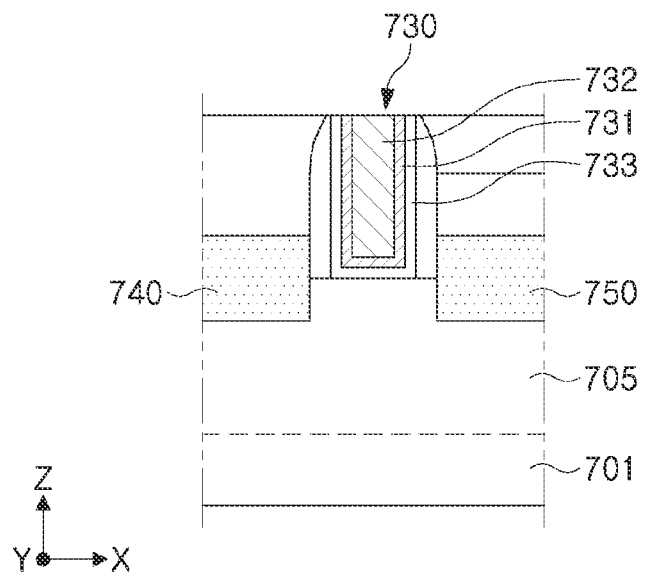

Referring to FIGS. 10A and 18, in operation S60, a gate dielectric layer 733 and gate electrodes 731 and 732 are deposited in the opening OR to form a gate structure 730.

The gate dielectric layer 733 may be formed to conformally cover an upper surface of the active fin 705 and the gate spacer layers 714 in the opening OR. The forming of the gate electrodes 731 and 732 may include sequentially forming a first gate layer 731 and a second gate layer 732 on the gate dielectric layer 733. Accordingly, a gate structure 730 including the gate electrodes 731 and 732, the gate dielectric layer 733, and the gate spacer layers 714 may be formed.

Referring to FIGS. 10A and 2 together, in operation S70, contacts 161 and 162 of FIG. 2 are formed to be connected to the source/drain regions 740 and 750.

The contacts may be formed by forming contact openings to expose the source/drain regions 740 and 750 through the interlayer insulating layer 770, and then depositing a conductive material in the contact openings.

In the example embodiments of FIGS. 11 to 18, description has been provided regarding a method of manufacturing a semiconductor device in the case in which a single gate structure 730 is provided. However, the method of manufacturing a semiconductor device disclosed with reference to FIGS. 11 to 18 may be equally applied to a case in which a plurality of gate structures 730 are formed.

FIGS. 19, 20, 21, 22, 23, 24 and 25 illustrate process flow diagrams of a method of manufacturing a semiconductor device according to embodiments of the inventive concepts.

The method illustrated in FIGS. 19 to 25 is similar to the method of manufacturing the semiconductor device with reference to FIGS. 10A to 18, but is however different in that counter-doping is not performed in the example embodiment of FIGS. 19 to 25. For example, in the embodiments of FIGS. 19 to 25, an ion implantation process of doping same or different conductivity-type impurity elements is not additionally performed after an in-situ doping process is performed. For example, in a comparative example, a doping concentration of source/drain regions of a FinFET device was increased by an additional ion implantation process after an epitaxial growth process was performed. Meanwhile, in the present embodiment, which includes for example manufacturing a FinFET as an analog device such as an input/output (I/O) device, the additional ion implantation process for reducing deterioration of hot carrier characteristics and generation of GIDL caused by a high electric field in a device driven by a high voltage such as 3.3V is omitted. Otherwise, the semiconductor device may be manufactured through similar operations as described with reference to FIG. 10A.

Figure 19:
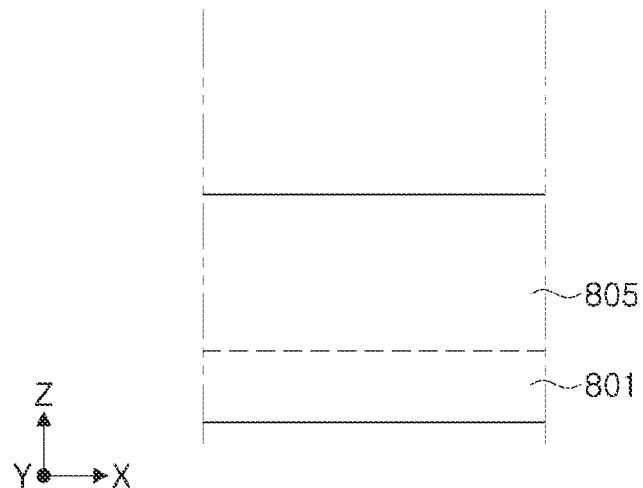
FIGS. 19, 20, 21, 22, 23, 24 and 25 illustrate process flow diagrams of a method of manufacturing a semiconductor device according to embodiments of the inventive concepts.

For example, with reference to FIGS. 10A and 19, in operation S10, an active fin 805 is formed on a substrate 801.

Figure 20:
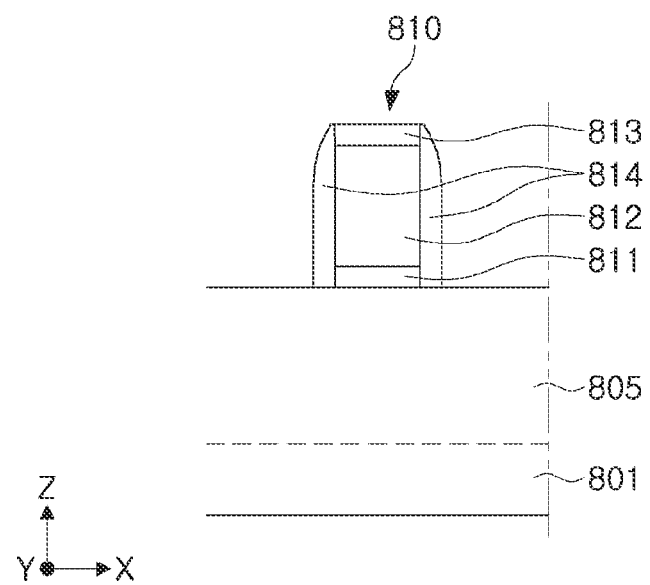

With reference to FIGS. 10A and 20, in operation S20, a sacrificial gate structure 810 including sacrificial gate patterns 811, 812, and 813 intersecting the active fin 805 are formed, and gate spacer layers 814 are formed.

Figure 21:
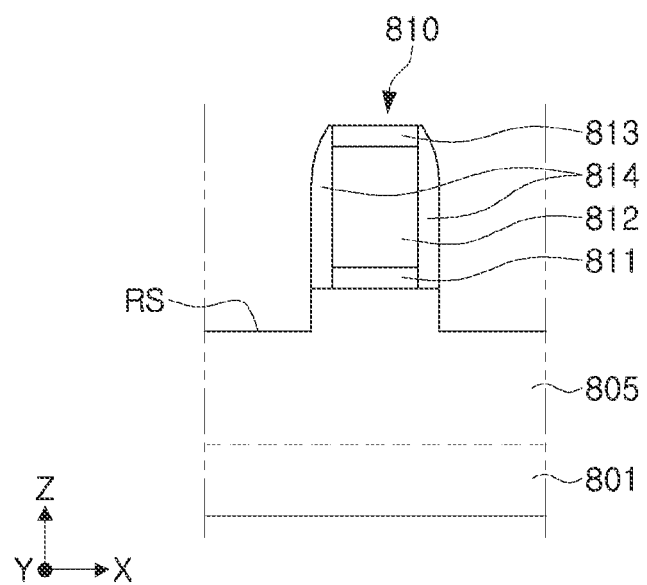

With reference to FIGS. 10A and 21, in operation S30, a recess region RS is formed on the active fin 805 on opposite sides of the sacrificial gate structure 810.

Figure 22:
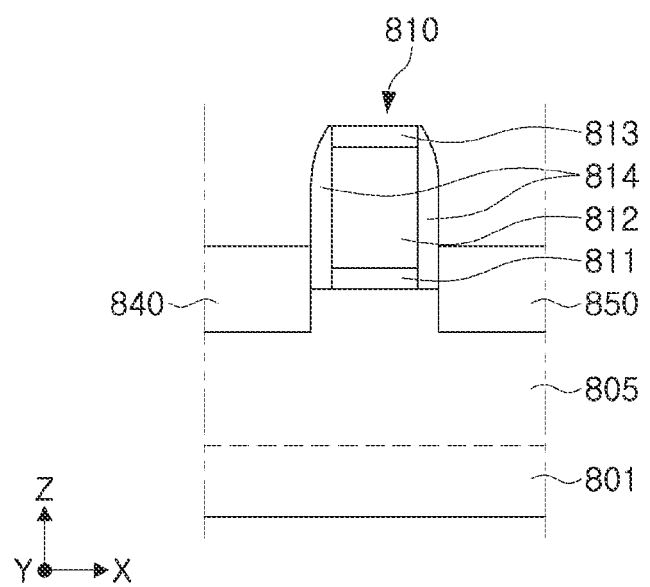

With reference to FIGS. 10A and 22, in operation S40, source/drain regions 840 and 850 are formed on the recess region RS of the active fin 805.

Figure 23:
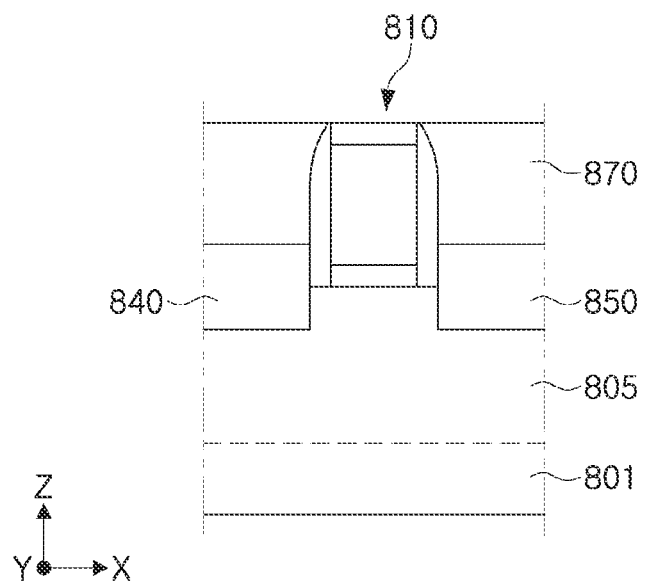
Figure 24:
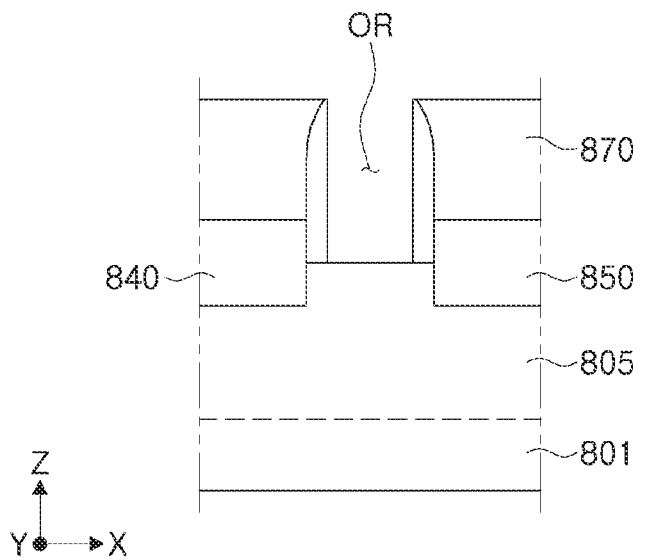

With reference to FIGS. 10A, 23 and 24, in operation S50, an opening OER is formed by forming an interlayer insulating layer 870 and removing the sacrificial gate patterns 811, 812, and 813, in a manner as described previously with reference to FIGS. 16 and 17 for example.

Figure 25:
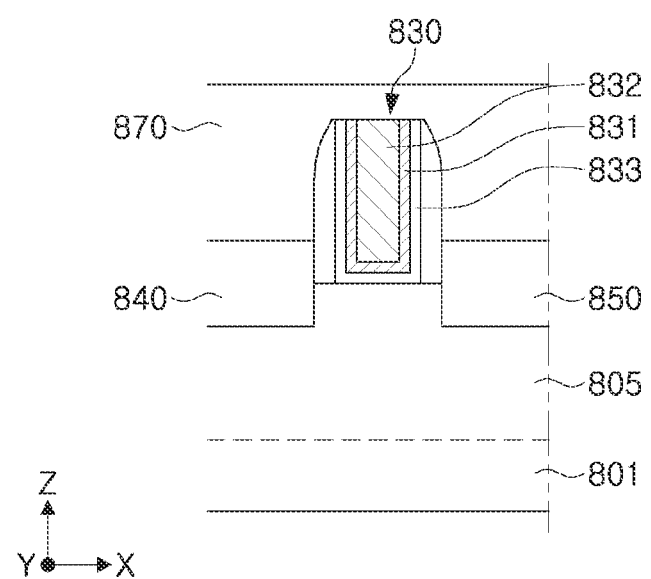

With reference to FIGS. 10A and 25, in operation S60, a gate dielectric layer 833 and gate electrodes 831 and 832 are deposited in the opening OR to form a gate structure 830.

With further reference to FIG. 10A, in operation S70, contacts (161 and 162 in FIG. 2) may be formed to be connected to the source/drain regions 840 and 850.

In the embodiment described with reference to FIGS. 19-25, the source/drain regions 840 and 850 may be formed by performing an epitaxial growth process and an in-situ doping process. However, a concentration of impurities or carriers may be determined by only an in-situ doping process, because additional ion implantation is not performed in a subsequent process.

Figure 26:
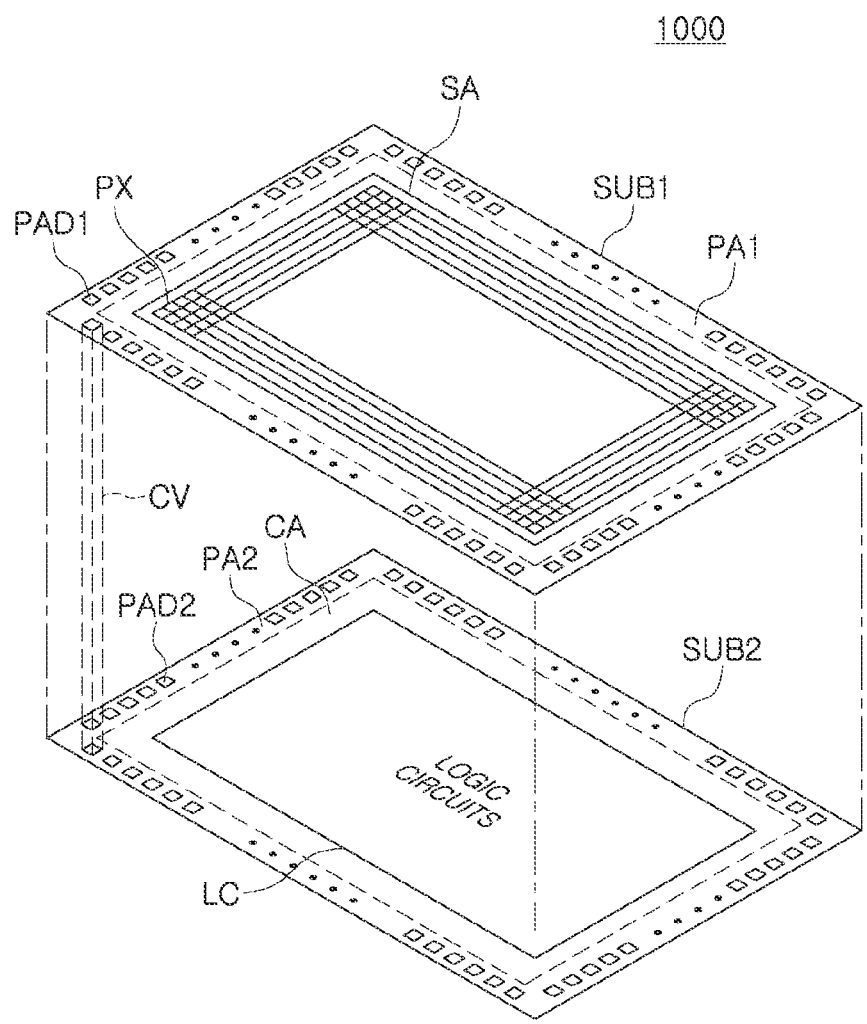
FIG. 26 illustrates an exploded perspective view of a CMOS image sensor including transistors of a semiconductor device according to embodiments of the inventive concepts.

FIG. 26 illustrates an exploded perspective view of a CMOS image sensor (CIS) including transistors of a semiconductor device according to embodiments of the inventive concepts.

Referring to FIG. 26, an image sensor 1000 may be a stack-type image sensor including a first substrate SUB1 and a second substrate SUB2 stacked in a vertical direction. The first substrate SUB1 may include a sensing region SA and a first pad region PA1, and the second substrate SUB2 may include a circuit region CA and a second pad region PA2. The sensing region SA may include a plurality of pixels PX arranged along a plurality of row lines and a plurality of column lines. The first pad region PA1 may include a plurality of first pads PAD1 configured to transmit and receive an electrical signal to and from the circuit region CA and the second pad region PA2 of the second substrate SUB2. The circuit region CA may include a logic circuit block LC, and may include a plurality of circuit devices constituting a row driver, a readout circuit, a column driver, and the like. The circuit region CA may provide a plurality of control signals to the sensing region SA to control an output from the plurality of pixels PX.

The first pads PAD in the first pad region PA1 may be electrically connected to the second pads PAD2 in the second pad region PA2 by a connection portion CV. A structure of the image sensor 1000 is not limited to that illustrated in FIG. 26 and may be variously modified according to embodiments. For example, the image sensor 1000 may further include at least one substrate provided below the second substrate SUB2 and including a memory chip such as a DRAM, an SRAM, or the like.

According to an example, a transistor of the semiconductor device manufactured according to embodiments of the inventive concepts may be applied to a plurality of circuit devices in the circuit region CA included in the second substrate SUB2 of the image sensor 1000. According to an example, the semiconductor device manufactured according to example embodiments may be applied to an analog-to-digital converter (ADC), a radio-frequency (RF) device, an input/output (I/O) device, and the like. However, application examples of the semiconductor device manufactured according to example embodiments are not limited thereto.

Figure 27:
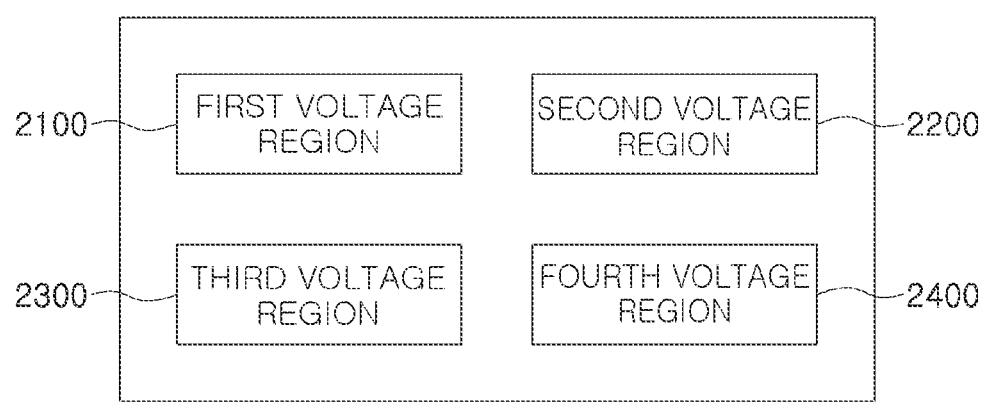
FIG. 27 illustrates a schematic view of a substrate structure in which transistors of a semiconductor device according to embodiments of the inventive concepts are formed.

FIG. 27 illustrates a schematic view of a substrate structure in which transistors of a semiconductor device according to embodiments of the inventive concepts are formed.

Referring to FIG. 27, a substrate structure 2000, on which transistors of a semiconductor device according to embodiments of the inventive concepts are formed, may be a lower plate of a CMOS image sensor. The substrate structure 2000 may include, for example, a plurality of voltage regions 2100, 2200, 2300, and 2400 to which different driving voltages are input. Therefore, a driving voltage applied to one of the plurality of voltage regions 2100, 2200, 2300, and 2400 may be relatively higher or lower than a driving voltage applied to the other voltage regions. The plurality of voltage regions 2100, 2200, 2300, and 2400 may include a first voltage region 2100, a second voltage region 2200, a third voltage region 2300, and a fourth voltage region 2400. Each of the plurality of voltage regions 2100, 2200, 2300, and 2400 may include a plurality of transistors.

In an example embodiment, a driving voltage of the plurality of first transistors disposed in the first voltage region 2100 may be about 0.8V, or may have a range of about 0.6V to about 1.0V. A driving voltage of the plurality of second transistors disposed in the second voltage region 2200 may be about 1.8V, or may have a range of about 1.6V to about 2.0V. A driving voltage of the plurality of third transistors disposed in the third voltage region 2300 may be about 2.2V, or may have a range of about 2.0V to about 2.4V. A driving voltage of the plurality of fourth transistors disposed in the fourth voltage region 2400 may be about 3.3V, or may have a range of about 3.1V to about 3.5V. However, detailed numerical ranges of the driving voltages are only an example, and the driving voltage in each of the plurality of voltage regions 2100, 2200, 2300, and 2400 may be provided to have a value, different from the above example.

In an example embodiment, the plurality of transistors included in each of the plurality of voltage regions 2100, 2200, 2300, and 2400 may have different driving voltages for each voltage region. The plurality of transistors included in a certain voltage region may be transistors which may be driven by a driving voltage in the voltage region.

Figure 28:
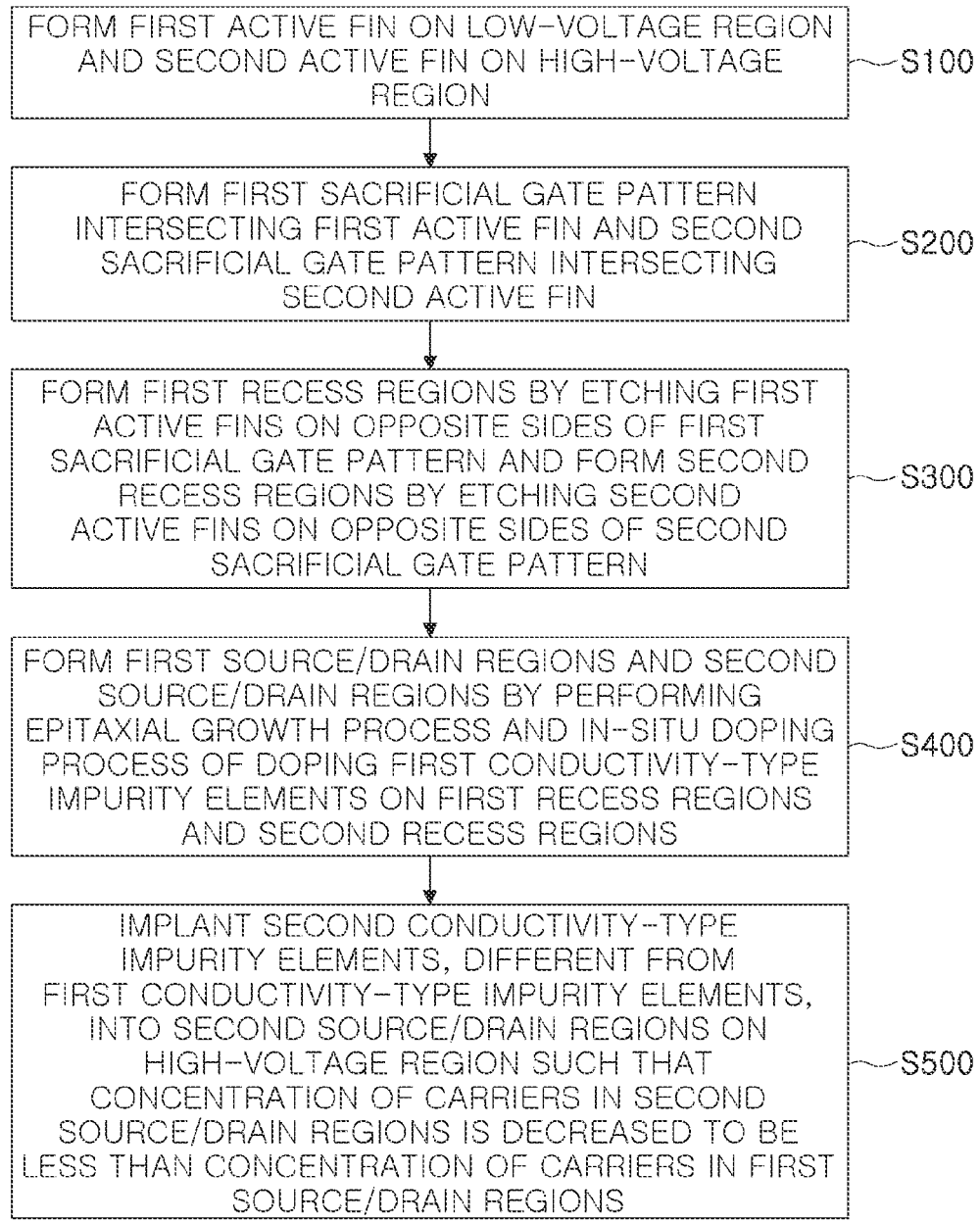
FIG. 28 illustrates a process flowchart of a method of manufacturing a semiconductor device according to embodiments of the inventive concepts.

FIG. 28 illustrates a process flowchart of a method of manufacturing a semiconductor device according to embodiments of the inventive concepts. FIG. 28 illustrates an example of a flow in which a transistor is formed on a low-voltage region and a transistor is formed on a high-voltage region together in a plurality of voltage regions 2100, 2200, 2300, and 2400 driven by different driving voltages, as described in the substrate structure 2000 of FIG. 27.

In operation S100, a first active fin on a low-voltage region and a second active fin on a high-voltage region are formed. The high-voltage region may correspond to, for example, the fourth voltage region 2400 of FIG. 27, and the low-voltage region may correspond to, for example, the first voltage region 2100 of FIG. 27. The first active fin and the second active fin may be formed to extend in a first direction by patterning a substrate. The first active fin and the second active fin may be formed in the same operation, for example, simultaneously, but example embodiments are not limited thereto.

In operation S200, a first sacrificial gate pattern intersecting the first active fin, and a second sacrificial gate pattern intersecting the second active fin, are formed. The first sacrificial gate pattern and the second sacrificial gate pattern may be formed to extend in a second direction, perpendicular to the first direction. The first sacrificial gate pattern and the second sacrificial gate pattern may be formed in the same operation, for example, simultaneously, but example embodiments are not limited thereto.

In operation S300, the first active fins on opposite sides of the first sacrificial gate pattern are etched to form first recess regions, and the second active fins on opposite sides of the second sacrificial gate pattern are etched to form second recess regions. The first recess regions may be formed by etching a portion the first active fin to be removed downwardly from an upper end of the first active fin by a predetermined depth. The second recess regions may be formed by etching a portion of the second active fin to be removed downwardly from an upper end of the second active fin by a predetermined depth. The first recess regions and the second recess regions may be formed in the operation, for example, simultaneously, but example embodiments are not limited thereto.

In operation S400, an epitaxial growth process and an in-situ doping process of doping first conductivity-type impurity elements are performed to form first source/drain regions on the first recess regions, and to form second source/drain regions on the second recess regions. The first source/drain regions and the second source/drain regions may be formed as epitaxial layers by performing an epitaxial growth process from the first recess regions and the second recess regions. The first source/drain regions and the second source/drain regions may be formed in the same operation, for example, simultaneously, but example embodiments are not limited thereto.

In operation S500, second conductivity-type impurity elements, different from the first conductivity-type impurity elements, are implanted into the second source/drain region on the high-voltage region such that a concentration of carriers in the second source/drain regions is decreased to be less than a concentration of carriers in the first source/drain regions. A doping concentration of the second conductivity-type impurity elements may be less than a doping concentration of the first conductivity-type impurity elements. The second source/drain regions may include a source region and a drain region, and a total carrier concentration of the drain region may be different from a total carrier concentration of the source region. For example, forming the drain region may include implanting the first conductivity-type impurity elements to form an initial drain region having a first carrier concentration, and counter-doping the second conductivity-type impurity elements into the initial drain region to form or change the initial drain region into a drain region having a second carrier concentration less than a first carrier concentration.

Then, referring to FIG. 10A, interlayer insulating layers are formed, the first and second sacrificial gate patterns are removed to form an opening, a gate dielectric layer and a gate electrode may be deposited in the opening to form a gate structure, and first and second source/drain contacts may be formed to be connected to the first and second source/drain regions.

As described above, example embodiments provide a semiconductor device in which occurrence of gate induced drain leakage (GIDL) and generation of hot carriers in a transistor, to which a high voltage is applied as a driving voltage, may be reduced or significantly reduced to improve electrical characteristics and reliability.

While example embodiments have been shown and described above, it should be apparent to those skilled in the art that modifications and variations may be made without departing from the scope of the inventive concept as defined by the appended claims.

What is claimed is:

1. A method of manufacturing a semiconductor device, the method comprising:
    forming an active fin to protrude from a substrate and extend in a first direction;
    forming a sacrificial gate pattern to intersect the active fin and extend in a second direction, the second direction perpendicular to the first direction;
    forming a recess region on the active fin on at least one side of the sacrificial gate pattern;
    forming a source/drain region on the recess region of the active fin;
    removing the sacrificial gate pattern to form an opening; and
    depositing a gate dielectric layer and a gate electrode to form a gate structure that covers the active fin in the opening,
    wherein the forming the source/drain region comprises
        forming an initial source/drain region having a first carrier concentration on the recess region of the active fin by performing an epitaxial growth process and an in-situ doping process of doping first conductivity-type impurity elements, and
        forming the source/drain region having a second carrier concentration less than the first carrier concentration by changing a carrier concentration of the initial source/drain region.

2. The method of claim 1, wherein the forming the source/drain region having the second carrier concentration comprises counter-doping second conductivity-type impurity elements into the initial source/drain region, the second conductivity-type impurity elements are different from the first conductivity-type impurity elements.

3. The method of claim 2, wherein a doping concentration of the second conductivity-type impurity elements is less than a doping concentration of the first conductivity-type impurity elements.

4. The method of claim 2, wherein the counter-doping comprises performing ion implantation.

5. The method of claim 2, wherein the forming the initial source/drain region comprises forming an initial source region and an initial drain region on opposite sides of the sacrificial gate pattern.

6. The method of claim 5, wherein the counter-doping is performed on at least one of the initial source region and the initial drain region.

7. The method of claim 2, wherein the first conductivity-type impurity element includes at least one of phosphorus (P), arsenic (As), bismuth (Bi), and antimony (Sb), and
    the second conductivity-type impurity element includes at least one of boron (B), indium (In), and gallium (Ga).

8. The method of claim 2, wherein the first conductivity-type impurity element includes at least one of boron (B), indium (In), and gallium (Ga), and
    the second conductivity-type impurity element includes at least one of phosphorus (P), arsenic (As), bismuth (Bi), and antimony (Sb).

9. The method of claim 1, further comprising forming gate spacer layers on opposite sides of the sacrificial gate pattern after forming the sacrificial gate pattern,
    wherein the forming the recess region comprises recessing the active fin using the sacrificial gate pattern and the gate spacer layers as etching masks.

10. The method of claim 1, wherein the gate dielectric layer has a thickness ranging from about 1.5 nanometers or more to about 10 nanometers or less.

11. The method of claim 1, further comprising:
    forming an interlayer insulating layer on the sacrificial gate pattern and the source/drain region; and
    forming a contact to be connected to the source/drain region through the interlayer insulating layer.

12. A method of manufacturing a semiconductor device, the method comprising:
    forming an active fin to protrude from a substrate and extend in a first direction;
    forming a plurality of sacrificial gate patterns to intersect the active fin and extend in a second direction, the second direction perpendicular to the first direction;
    forming recess regions by etching the active fin on at least one side of each of the plurality of sacrificial gate patterns;

forming source/drain regions on the recess regions of the active fin;

removing the plurality of sacrificial gate patterns to form a plurality of openings; and forming a gate dielectric layer and a gate electrode to form a plurality of gate structures that cover the active fin in the plurality of openings, wherein the source/drain regions are formed by performing an epitaxial growth process and an in-situ doping process of doping first conductivity-type impurity elements, and in at least one of the source/drain regions, after the in-situ doping process is performed, counter-doping is performed using second conductivity-type impurity elements to decrease a carrier concentration of the at least one of the source/drain regions, the second conductivity-type impurity elements are different from the first conductivity-type impurity elements.

13. The method of claim 12, wherein the counter-doping comprises performing ion implantation to implant the second conductivity-type impurity elements at a doping concentration less than a doping concentration of the first conductivity-type impurity elements.

14. The method of claim 12, wherein a total concentration of impurity elements in the at least one of the source/drain regions is increased by the counter-doping.

15. The method of claim 14, wherein impurity elements having opposing conductivity types coexist in the at least one of the source/drain regions on which the counter-doping is performed.

16. The method of claim 12, wherein the at least one of the source/drain regions on which the counter-doping is performed is provided as a drain region of a transistor.

17. A method of manufacturing a semiconductor device, the method comprising:

forming a first active fin on a low-voltage region of a substrate, and a second active fin on a high-voltage region of the substrate;

forming a first sacrificial gate pattern to intersect the first active fin, and a second sacrificial gate pattern to intersect the second active fin;

forming first recess regions by etching the first active fin on opposite sides of the first sacrificial gate pattern, and second recess regions by etching the second active fin on opposite sides of the second sacrificial gate pattern;

forming first source/drain regions on the first recess regions and second source/drain regions on the second recess regions by performing an epitaxial growth process and an in-situ doping process of doping first conductivity-type impurity elements; and implanting second conductivity-type impurity elements into the second source/drain regions on the high-voltage region such that a concentration of carriers in the second source/drain regions is decreased to be less than a concentration of carriers in the first source/drain regions, the second conductivity-type impurity elements are different from the first conductivity-type impurity elements.

18. The method of claim 17, wherein a doping concentration of the second conductivity-type impurity elements is less than a doping concentration of the first conductivity-type impurity elements.

19. The method of claim 17, wherein the second source/drain regions include a source region and a drain region, and a total carrier concentration of the drain region is different from a total carrier concentration of the source region.

20. The method of claim 19, wherein forming the drain region comprises:

implanting the first conductivity-type impurity elements to form an initial drain region having a first carrier concentration; and counter-doping the second conductivity-type impurity elements into the initial drain region to form the drain region having a second carrier concentration that is less than the first carrier concentration.

* * * * *